US012696532B2

(12) United States Patent
Kao et al.

(10) Patent No.: US 12,696,532 B2
(45) Date of Patent: Jul. 28, 2026

(54) SEMICONDUCTOR DEVICE STRUCTURE WITH GATE DIELECTRIC LAYER AND METHOD FOR FORMING THE SAME

(71) Applicant: TAIWAN SEMICONDUCTOR MANUFACTURING COMPANY, LTD., Hsinchu (TW)

(72) Inventors: Wei-Chih Kao, Taipei (TW); Hsin-Che Chiang, Taipei City (TW); Jeng-Ya Yeh, New Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 574 days.

(21) Appl. No.: 18/166,750

(22) Filed: Feb. 9, 2023

(65) Prior Publication Data

US 2024/0120334 A1     Apr. 11, 2024

Related U.S. Application Data

(60) Provisional application No. 63/411,818, filed on Sep. 30, 2022.

(51) Int. Cl.
  H10D 84/83     (2025.01)
  H10D 84/01     (2025.01)
  H10D 84/03     (2025.01)
(52) U.S. Cl.
  CPC ......... H10D 84/834 (2025.01); H10D 84/014 (2025.01); H10D 84/038 (2025.01)

(58) Field of Classification Search
  CPC ........... H10D 84/0151; H10D 84/0188; H10D 84/0158; H10D 84/0193; H10D 84/83; H10D 84/834; H10D 84/0144; H10D 30/024; H10D 30/62
  See application file for complete search history.

(56) References Cited

U.S. PATENT DOCUMENTS

2019/0115346 A1 *  4/2019  Kannan .............. H10D 84/0172
2019/0221431 A1 *  7/2019  Hsieh ................... H10D 64/017

FOREIGN PATENT DOCUMENTS

EP           1511074 B1 *  1/2015  ........ H01L 21/31111

* cited by examiner

*Primary Examiner* — Tuan A Hoang
(74) *Attorney, Agent, or Firm* — Birch, Stewart, Kolasch & Birch, LLP

(57) ABSTRACT

A method for forming a semiconductor device structure is provided. The method includes forming an isolation layer over a substrate. The method includes forming a spacer layer over the first fin, the second fin, and the isolation layer. The method includes forming a gate dielectric layer in the first trench and covering the first fin, the second fin, and the isolation layer exposed by the first trench. The method includes partially removing the gate dielectric layer to form a second trench in the gate dielectric layer and between the first fin and the second fin. The method includes forming a gate electrode in the first trench of the spacer layer and over the gate dielectric layer.

20 Claims, 34 Drawing Sheets

SEMICONDUCTOR DEVICE STRUCTURE WITH GATE DIELECTRIC LAYER AND METHOD FOR FORMING THE SAME

PRIORITY CLAIM AND CROSS-REFERENCE

This application claims the benefit of U.S. Provisional Application No. 63/411,818, filed on Sep. 30, 2022, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1C are cross-sectional views of various stages of a process for forming a semiconductor device structure, in accordance with some embodiments.

FIG. 1A-1 is a perspective view of the semiconductor device structure of FIG. 1A, in accordance with some embodiments.

FIG. 1B-1 is a top view of the semiconductor device structure of FIG. 1B, in accordance with some embodiments.

FIG. 1C-1 is a perspective view of the semiconductor device structure of FIG. 1C, in accordance with some embodiments.

FIG. 2E-1 is a top view of the semiconductor device structure of FIG. 2E, in accordance with some embodiments.

FIG. 2F-1 is a top view of the semiconductor device structure of FIG. 2F, in accordance with some embodiments.

FIG. 2G-1 is a perspective view of a portion of the semiconductor device structure of FIG. 2G, in accordance with some embodiments.

FIG. 2G-2 is a top view of the semiconductor device structure of FIG. 2G, in accordance with some embodiments.

FIG. 2G-3 is a cross-sectional view illustrating the semiconductor device structure along a sectional line I-I' in FIG. 2G-2, in accordance with some embodiments.

FIG. 2H-1 is a top view of the semiconductor device structure of FIG. 2H, in accordance with some embodiments.

FIG. 2H-2 is a cross-sectional view illustrating the semiconductor device structure along a sectional line I-I' in FIG. 2H-1, in accordance with some embodiments.

FIG. 2I-1 is a top view of the semiconductor device structure of FIG. 2I, in accordance with some embodiments.

FIG. 2I-2 is a cross-sectional view illustrating the semiconductor device structure along a sectional line I-I' in FIG. 2I-1, in accordance with some embodiments.

FIG. 3A-1 is a perspective view of a portion of the semiconductor device structure of FIG. 3A, in accordance with some embodiments.

FIG. 3A-2 is a top view of the semiconductor device structure of FIG. 3A, in accordance with some embodiments.

FIG. 3A-3 is a cross-sectional view illustrating the semiconductor device structure along a sectional line I-I' in FIG. 3A-2, in accordance with some embodiments.

FIG. 3B-1 is a top view of the semiconductor device structure of FIG. 3B, in accordance with some embodiments.

FIG. 3B-2 is a cross-sectional view illustrating the semiconductor device structure along a sectional line I-I' in FIG. 3B-1, in accordance with some embodiments.

FIGS. 4A-4G are top views of various stages of a process for forming a semiconductor device structure, in accordance with some embodiments.

FIGS. 4A-1 to 4G-1 are cross-sectional views illustrating the semiconductor device structure along a sectional line I-I' in FIGS. 4A-4G, in accordance with some embodiments.

FIG. 4A-2 is a perspective view of the semiconductor device structure of FIG. 4A, in accordance with some embodiments.

FIG. 4G-2 is a perspective view of the semiconductor device structure of FIG. 4G, in accordance with some embodiments.

DETAILED DESCRIPTION

Figure 1A:
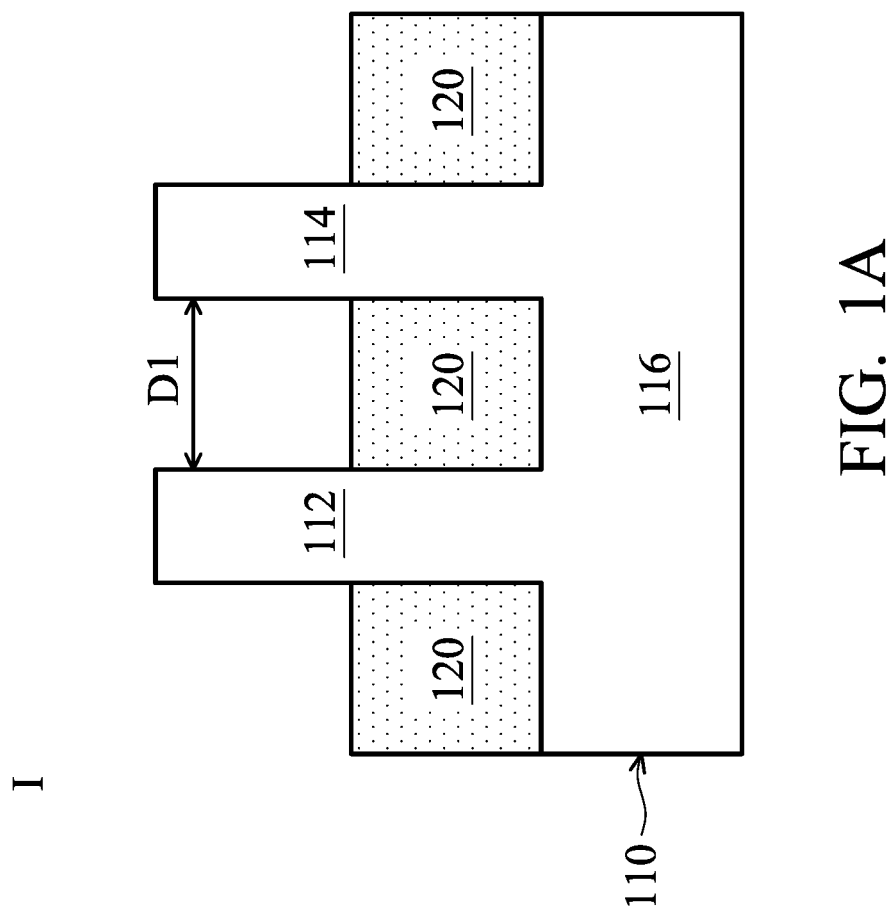

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Source/drain structure(s) may refer to a source or a drain, individually or collectively dependent upon the context.

Figures 1, 1A:
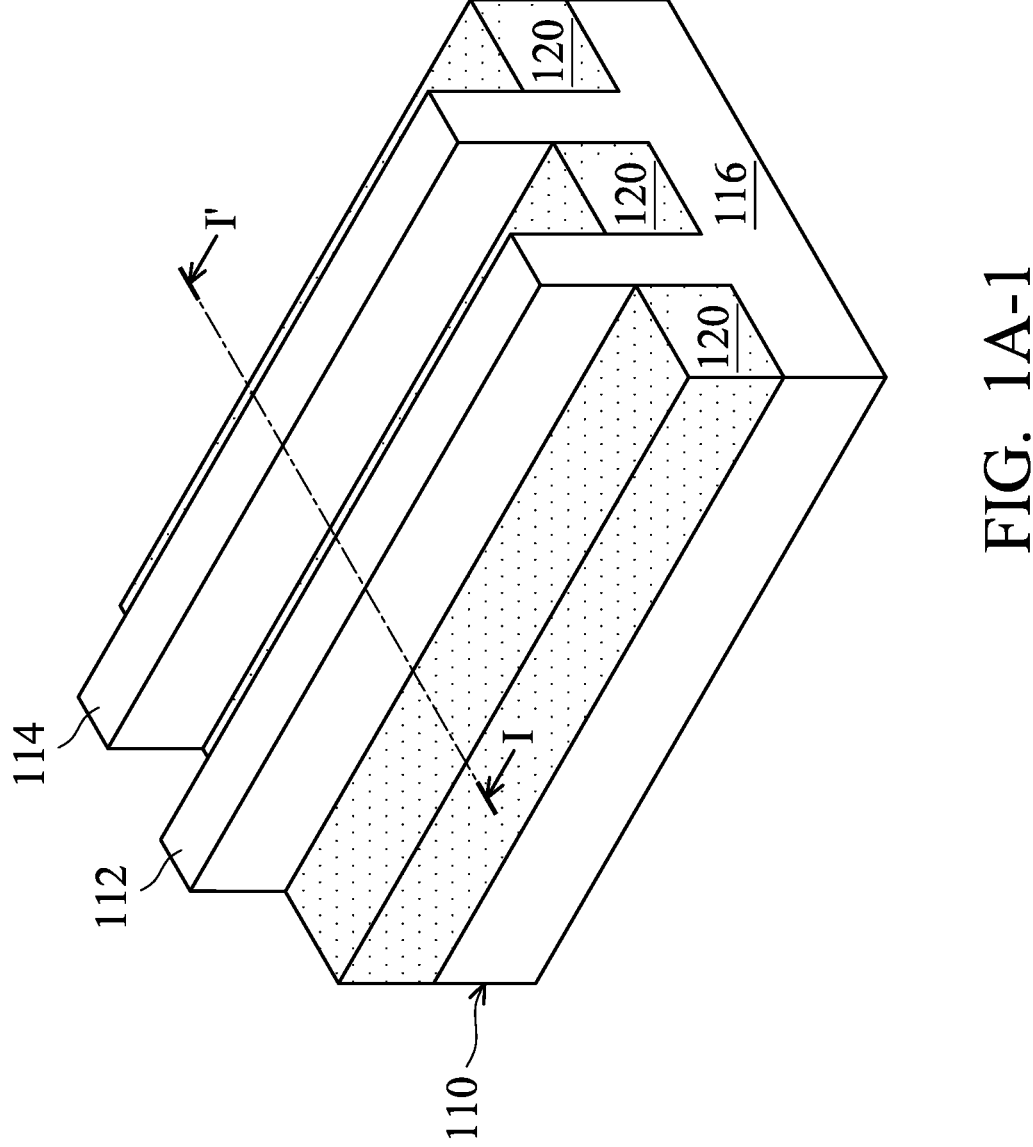
Figures 1, 1B:
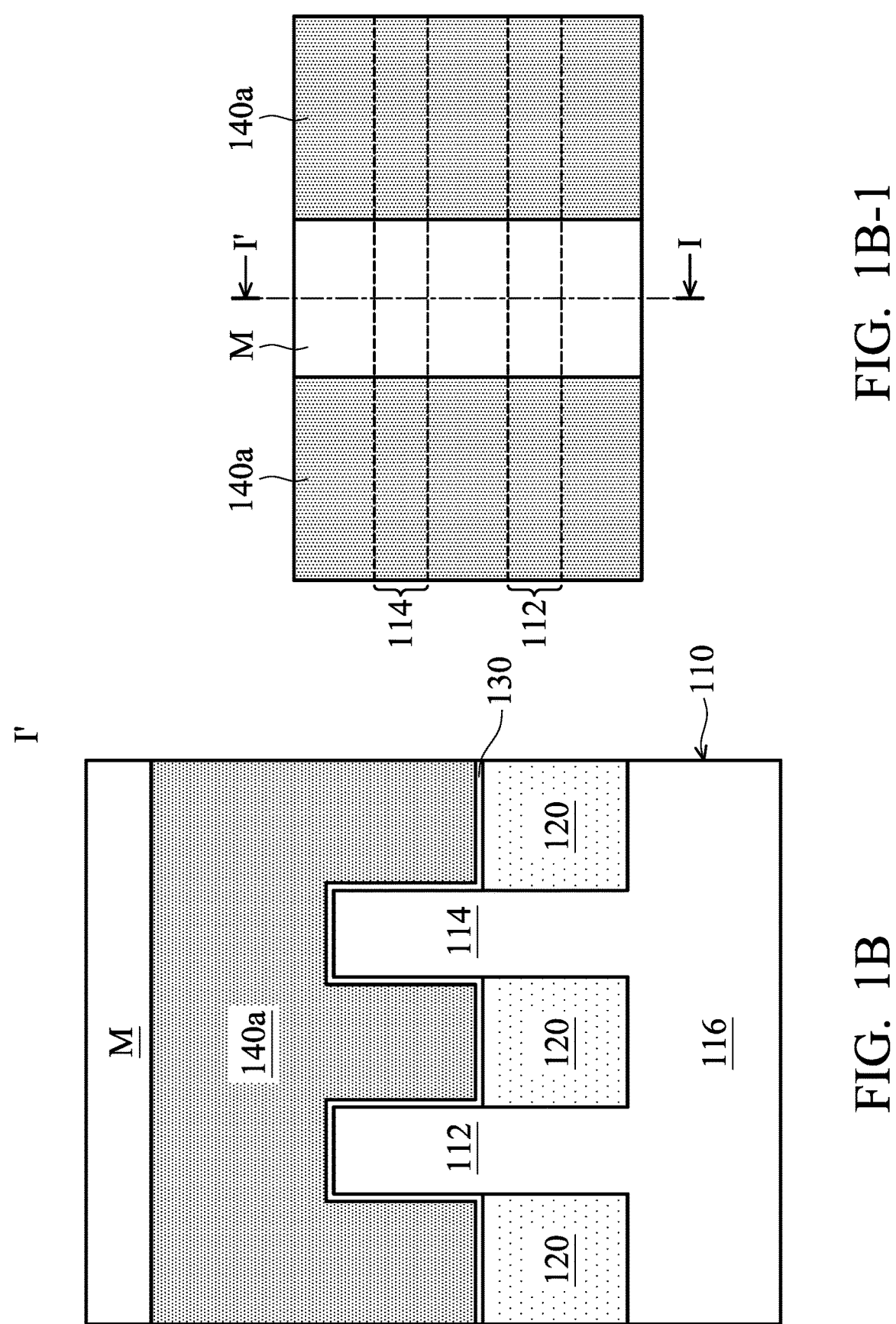
Figure 1C:
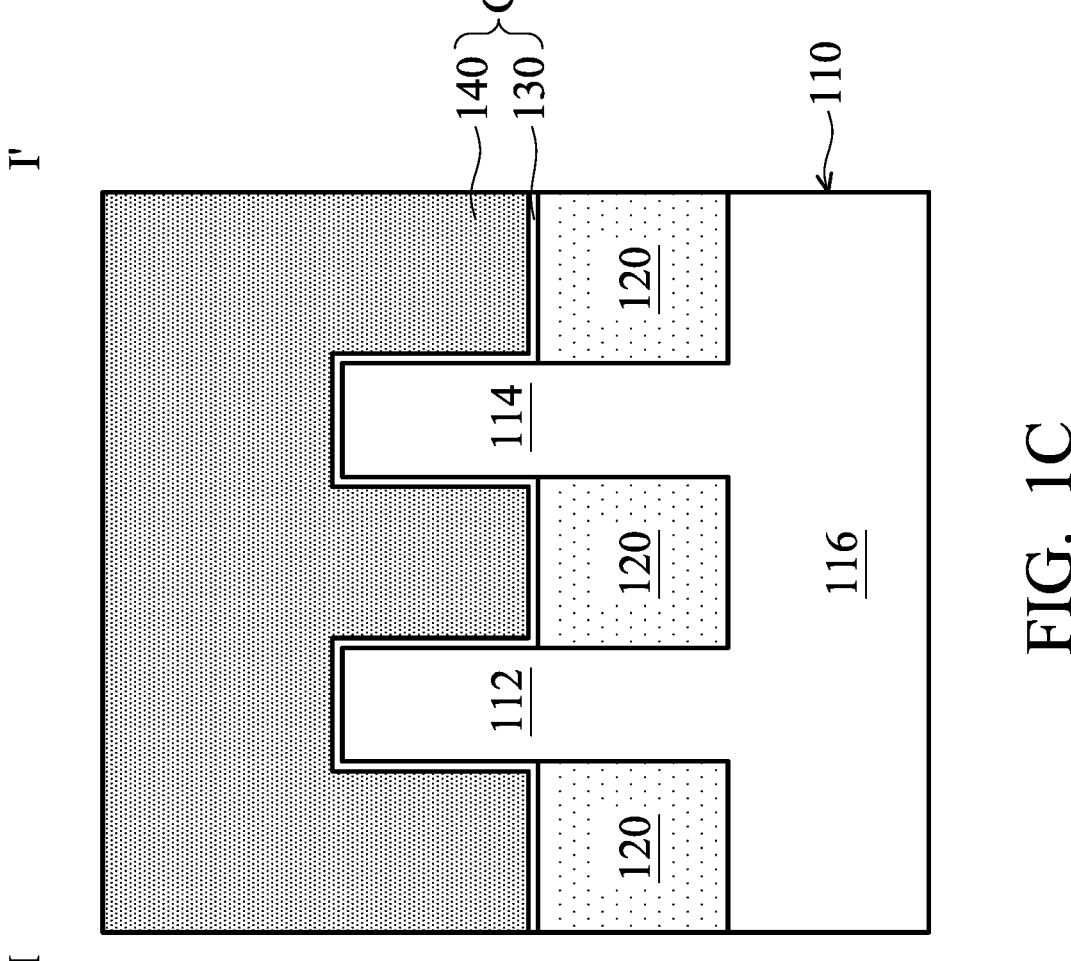
Figures 1, 1C:
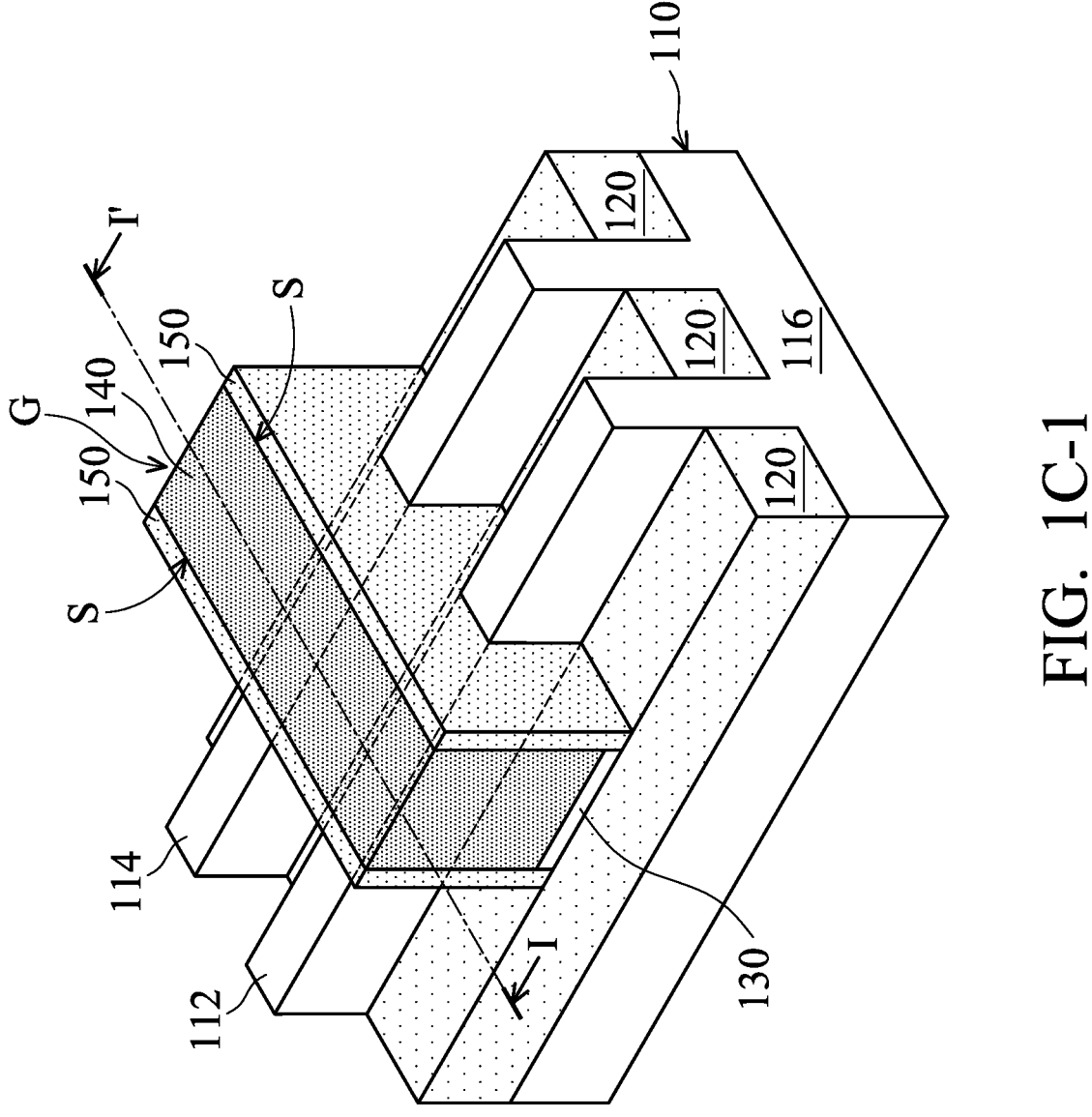

FIGS. 1A-1C are cross-sectional views of various stages of a process for forming a semiconductor device structure, in accordance with some embodiments. FIG. 1A-1 is a perspective view of the semiconductor device structure of FIG. 1A, in accordance with some embodiments. FIG. 1A is a cross-sectional view illustrating the semiconductor device structure along a sectional line I-I' in FIG. 1A-1, in accordance with some embodiments.

As shown in FIGS. 1A and 1A-1, a substrate 110 is provided, in accordance with some embodiments. As shown in FIGS. 1A and 1A-1, the substrate 110 has fins 112 and 114 and a base 116, in accordance with some embodiments. The fins 112 and 114 are over the base 116, in accordance with some embodiments. The fins 112 and 114 are spaced apart from each other by a distance D1, in accordance with some embodiments. The distance D1 ranges from about 20 nm to about 150 nm, in accordance with some embodiments.

The substrate 110 includes, for example, a semiconductor substrate. The semiconductor substrate includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity.

Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, an isolation layer 120 is formed over the base 116, in accordance with some embodiments. Each of the fin 112 or 114 is partially in the isolation layer 120, in accordance with some embodiments. The isolation layer 120 surrounds lower portions of the fins 112 and 114, in accordance with some embodiments.

The isolation layer 120 includes oxide (such as silicon oxide), in accordance with some embodiments. The isolation layer 120 is formed by a chemical vapor deposition (CVD) process and an etching back process, in accordance with some embodiments.

FIG. 1B-1 is a top view of the semiconductor device structure of FIG. 1B, in accordance with some embodiments. FIG. 1B is a cross-sectional view illustrating the semiconductor device structure along a sectional line I-I' in FIG. 1B-1, in accordance with some embodiments.

As shown in FIGS. 1B and 1B-1, a gate dielectric layer 130 is deposited over the isolation layer 120 and the fins 112 and 114, in accordance with some embodiments. The gate dielectric layer 130 conformally covers the isolation layer 120 and the fins 112 and 114, in accordance with some embodiments.

The gate dielectric layer 130 is made of oxide, such as silicon oxide (e.g. $SiO_2$), in accordance with some embodiments. The gate dielectric layer 130 is also referred to as an oxide layer, in accordance with some embodiments.

The gate dielectric layer 130 is deposited using a chemical vapor deposition (CVD) process, a thermal atomic layer deposition (ALD) process, a plasma enhanced atomic layer deposition (PEALD) process, or another suitable deposition process.

As shown in FIGS. 1B and 1B-1, a gate electrode layer 140a is formed over the gate dielectric layer 130, in accordance with some embodiments. The gate electrode layer 140a is in direct contact with the gate dielectric layer 130, in accordance with some embodiments.

The gate electrode layer 140a is made of a semiconductor material such as polysilicon, in accordance with some embodiments. The gate electrode layer 140a is formed using a chemical vapor deposition process or another suitable process.

As shown in FIGS. 1B and 1B-1, a mask layer M is formed over the gate electrode layer 140a, in accordance with some embodiments. The mask layer M is made of a photoresist material or another suitable material, which is different from the material of the gate electrode layer 140a, in accordance with some embodiments.

FIG. 1C-1 is a perspective view of the semiconductor device structure of FIG. 1C, in accordance with some embodiments. As shown in FIGS. 1B-1, 1C, and 1C-1, portions of the gate electrode layer 140a and the gate dielectric layer 130, which are not under the mask layer M, are removed, in accordance with some embodiments. The remaining gate electrode layer 140a forms a gate electrode 140, in accordance with some embodiments.

After the removal process, the gate electrode 140 and the remaining gate dielectric layer 130 together form a gate stack G, in accordance with some embodiments. Thereafter, as shown in FIGS. 1C and 1C-1, the mask layer M is removed, in accordance with some embodiments.

Afterwards, as shown in FIGS. 1C and 1C-1, a spacer layer 150 is formed over sidewalls S of the gate stack G, in accordance with some embodiments. The spacer layer 150 surrounds the gate stack G, in accordance with some embodiments. The spacer layer 150 is positioned over the fins 112 and 114 and the isolation layer 120, in accordance with some embodiments.

The spacer layer 150 includes insulating materials, such as silicon oxide, silicon nitride, silicon oxynitride, or silicon carbide, in accordance with some embodiments. The formation of the spacer layer 150 includes a deposition process and an anisotropic etching process, in accordance with some embodiments.

Figure 2A:
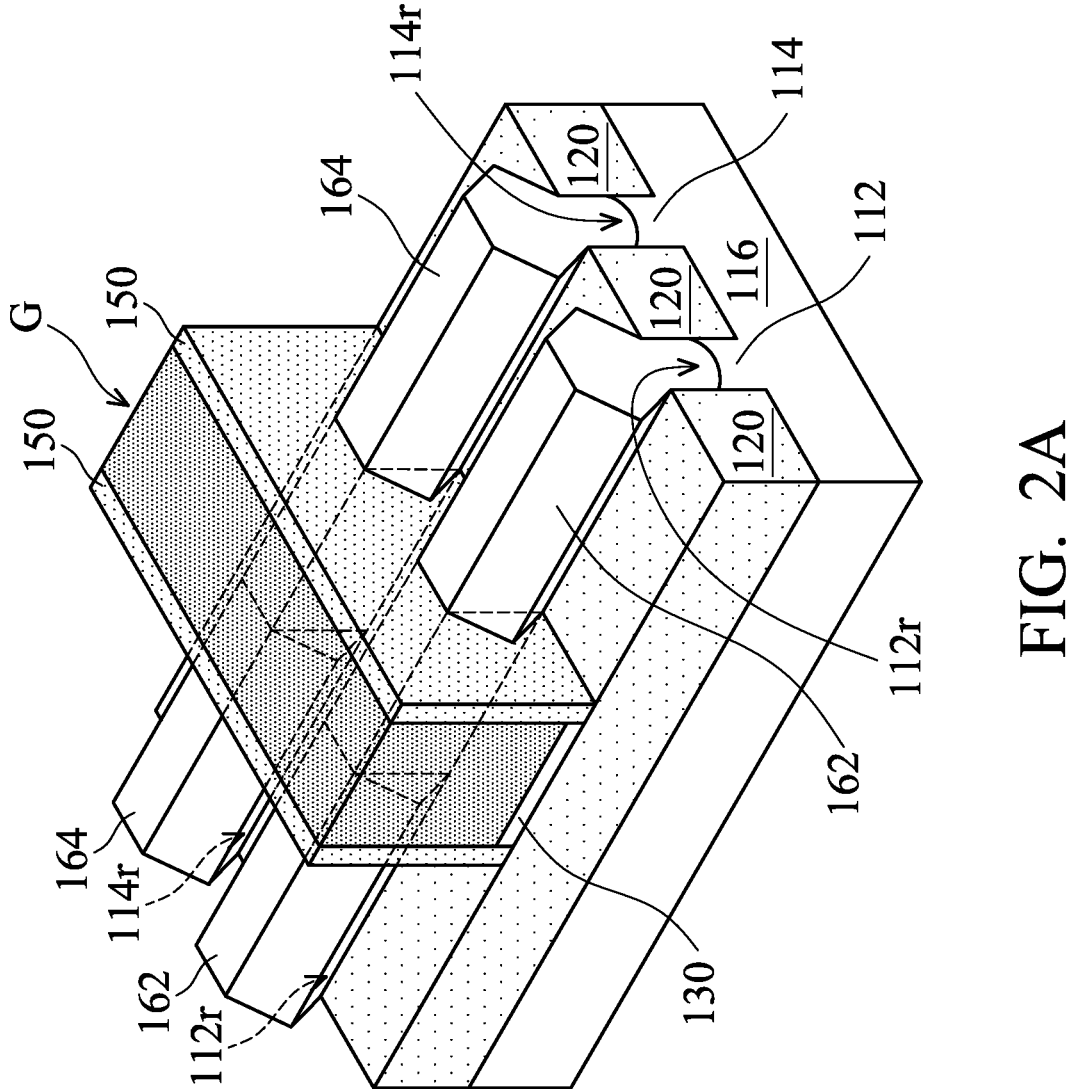
FIGS. 2A-2I are perspective views of various stages of a process for forming a semiconductor device structure, in accordance with some embodiments.

FIGS. 2A-2I are perspective views of various stages of a process for forming a semiconductor device structure, in accordance with some embodiments. After the step illustrated in FIG. 1C, as shown in FIG. 2A, the fins 112 and 114, which are not covered by the spacer layer 150 and the gate stack G, are partially removed, in accordance with some embodiments. After the removal process, as shown in FIG. 2A, recesses 112r and 114r are formed in the fins 112 and 114 respectively, in accordance with some embodiments.

As shown in FIG. 2A, source/drain structures 162 are formed in the recesses 112r of the fin 112, and source/drain structures 164 are formed in the recesses 114r of the fin 114, in accordance with some embodiments. The source/drain structures 162 are in direct contact with the fin 112, in accordance with some embodiments. The source/drain structures 162 are positioned on two opposite sides of the gate stack G, in accordance with some embodiments. The source/drain structures 162 include a source structure and a drain structure, in accordance with some embodiments.

The source/drain structures 164 are in direct contact with the fin 114, in accordance with some embodiments. The source/drain structures 164 are positioned on two opposite sides of the gate stack G, in accordance with some embodiments. The source/drain structures 164 include a source structure and a drain structure, in accordance with some embodiments.

In some embodiments, the source/drain structures 162 and 164 are made of different materials, in accordance with some embodiments. The source/drain structures 162 and 164 are formed using different epitaxial processes, in accordance with some embodiments.

The source/drain structures 162 or 164 are made of an N-type conductivity material, in accordance with some embodiments. The N-type conductivity material includes silicon phosphorus (SiP) or another suitable N-type conductivity material.

The source/drain structures 162 or 164 are doped with the Group VA element, in accordance with some embodiments. The Group VA element includes phosphor (P), antimony (Sb), or another suitable Group VA material. In some embodiments, a concentration of the Group VA element (e.g. phosphor) ranges from about 3E21 atoms/cm$^3$ to about 7E21 atoms/cm$^3$. The source/drain structures 162 and 164 are also referred to as doped structures, in accordance with some embodiments.

In some other embodiments, the source/drain structures 162 or 164 are made of a P-type conductivity material, in accordance with some embodiments. The P-type conductivity material includes silicon germanium (SiGe) or another suitable P-type conductivity material. The source/drain structures 162 or 164 are doped with the Group IIIA element, in accordance with some embodiments. The Group IIIA element includes boron or another suitable material.

Figure 2B:
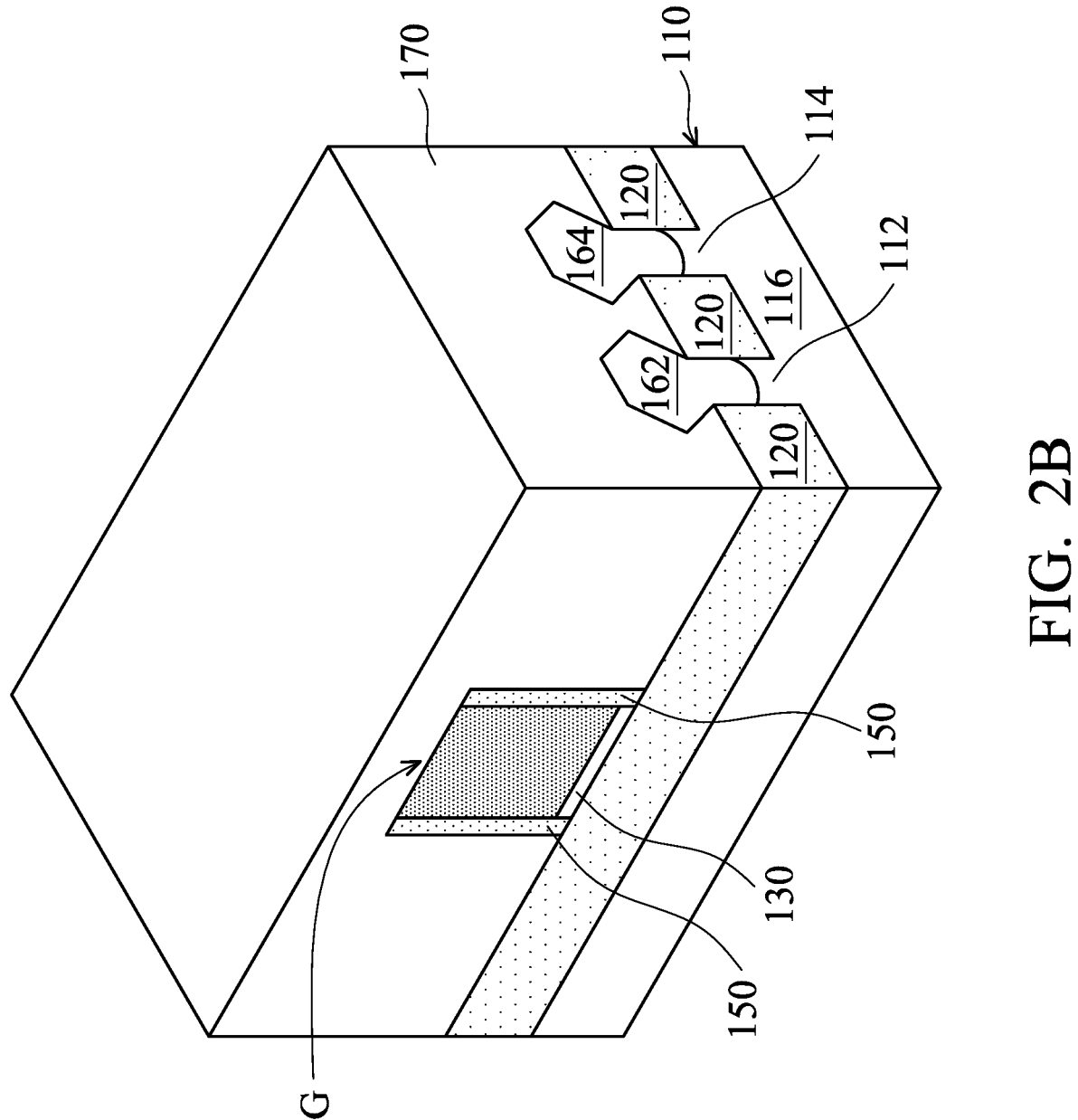

As shown in FIG. 2B, a dielectric layer 170 is formed over the gate stack G, the spacer layer 150, the isolation layer 120, and the source/drain structures 162 and 164, in accordance with some embodiments. The dielectric layer 170 includes an oxide-containing material (e.g., silicon oxide or tetraethyl orthosilicate oxide), an oxynitride-containing material (e.g., silicon oxynitride), a glass material (e.g., borosilicate glass, phosphoric silicate glass, boron phospho-silicate glass, or fluorinated silicate glass), or a combination thereof, in accordance with some embodiments. The dielectric layer 170 is formed by a chemical vapor deposition (CVD) process, in accordance with some embodiments.

Figure 2C:
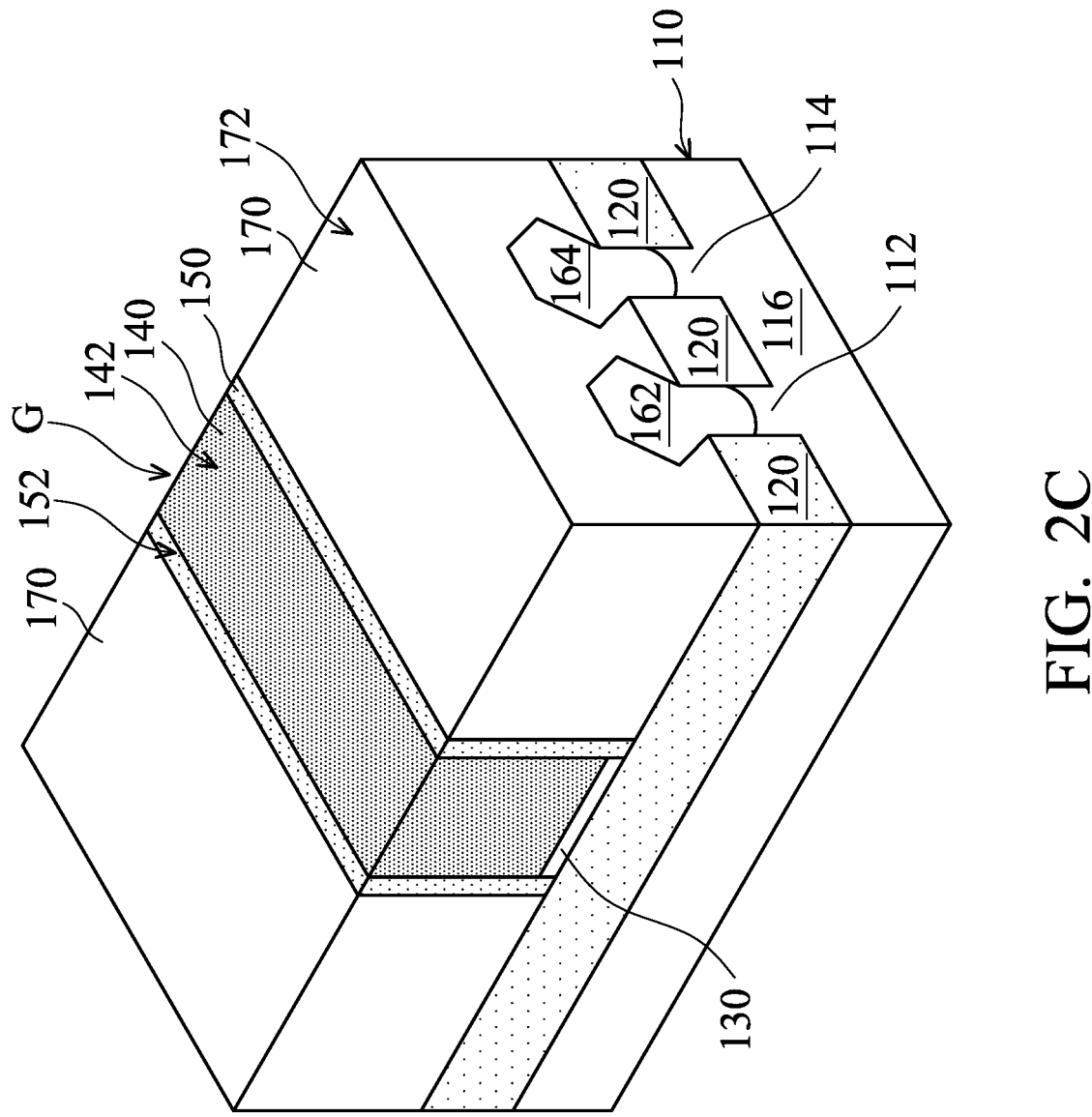

As shown in FIG. 2C, a planarization process is then performed on the dielectric layer 170 until a top surface 142 of the gate electrode 140 is exposed, in accordance with some embodiments. After the planarization process is performed, a top surface 152 of the spacer layer 150, a top surface 172 of the dielectric layer 170, and the top surface 142 of the gate electrode 140 are substantially level with each other, in accordance with some embodiments. The planarization process includes a chemical mechanical polishing (CMP) process, in accordance with some embodiments.

Figure 2D:
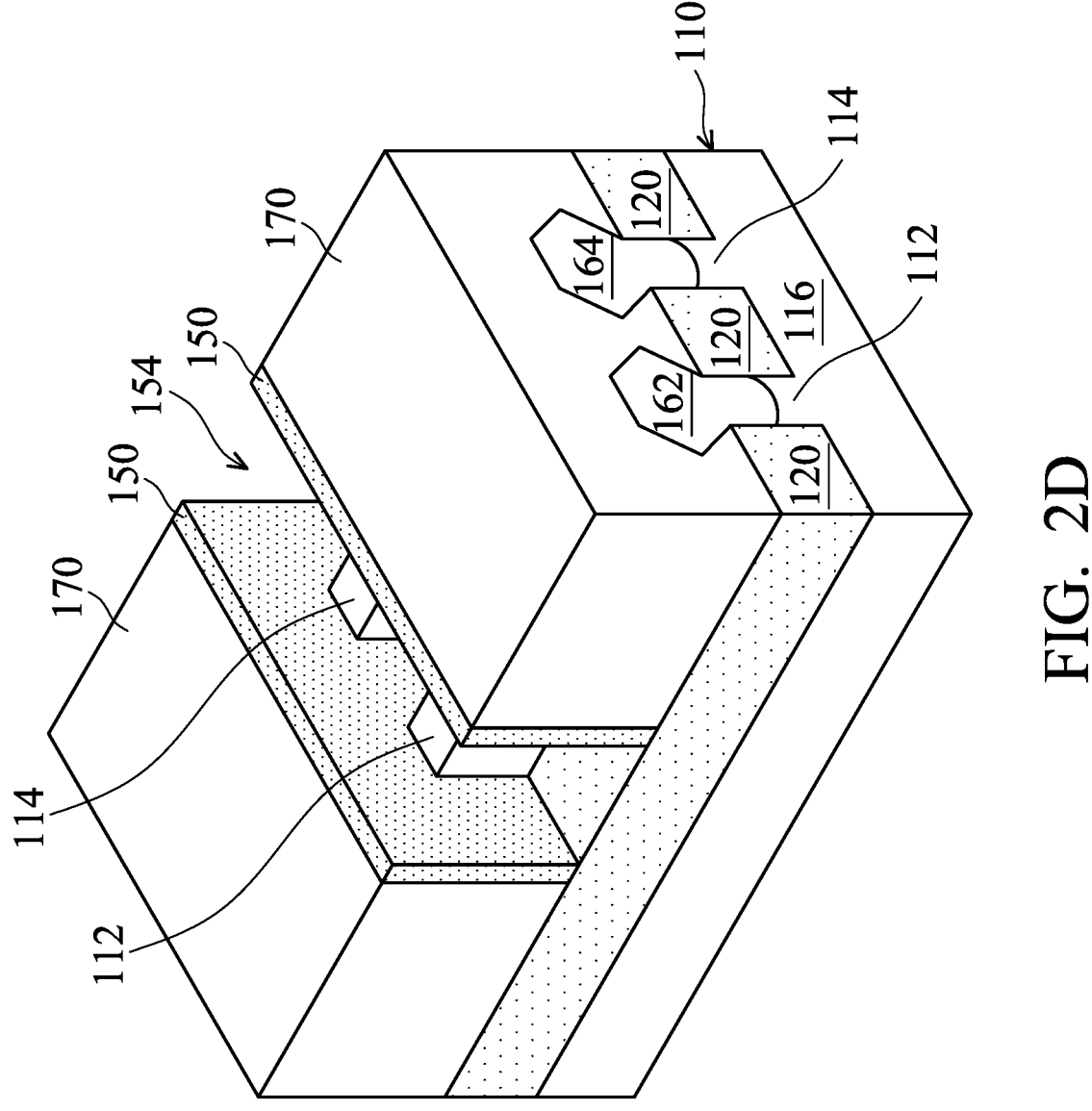

As shown in FIG. 2D, the gate dielectric layer 130 and the gate electrode 140 are removed, in accordance with some embodiments. The removal process includes an etching process such as a wet etching process, in accordance with some embodiments.

After the removal process, a trench 154 is formed in the spacer layer 150, in accordance with some embodiments. The trench 154 partially exposes the fins 112 and 114 and the isolation layer 120, in accordance with some embodiments.

Figure 2E:
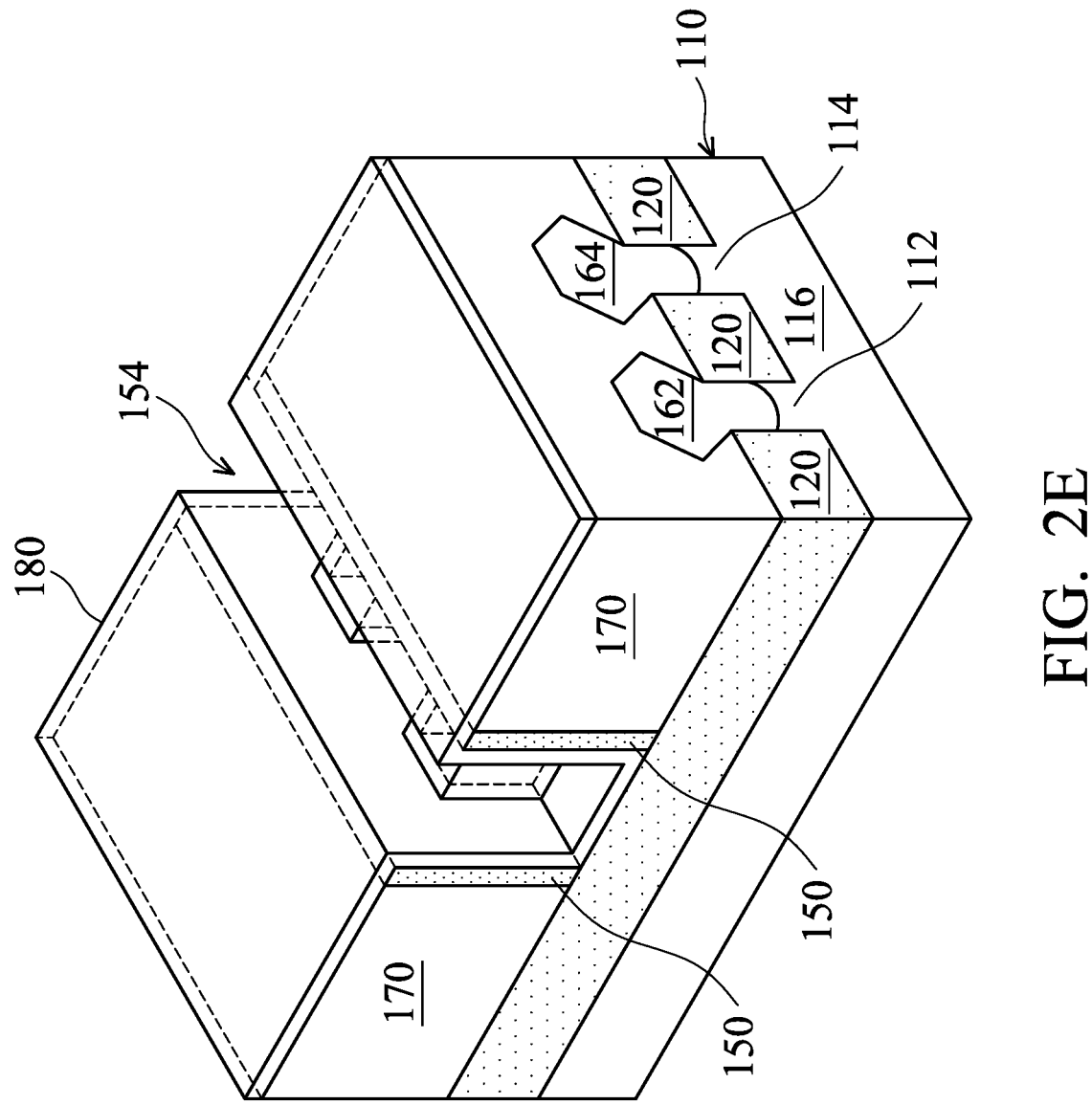
Figures 1, 2E:
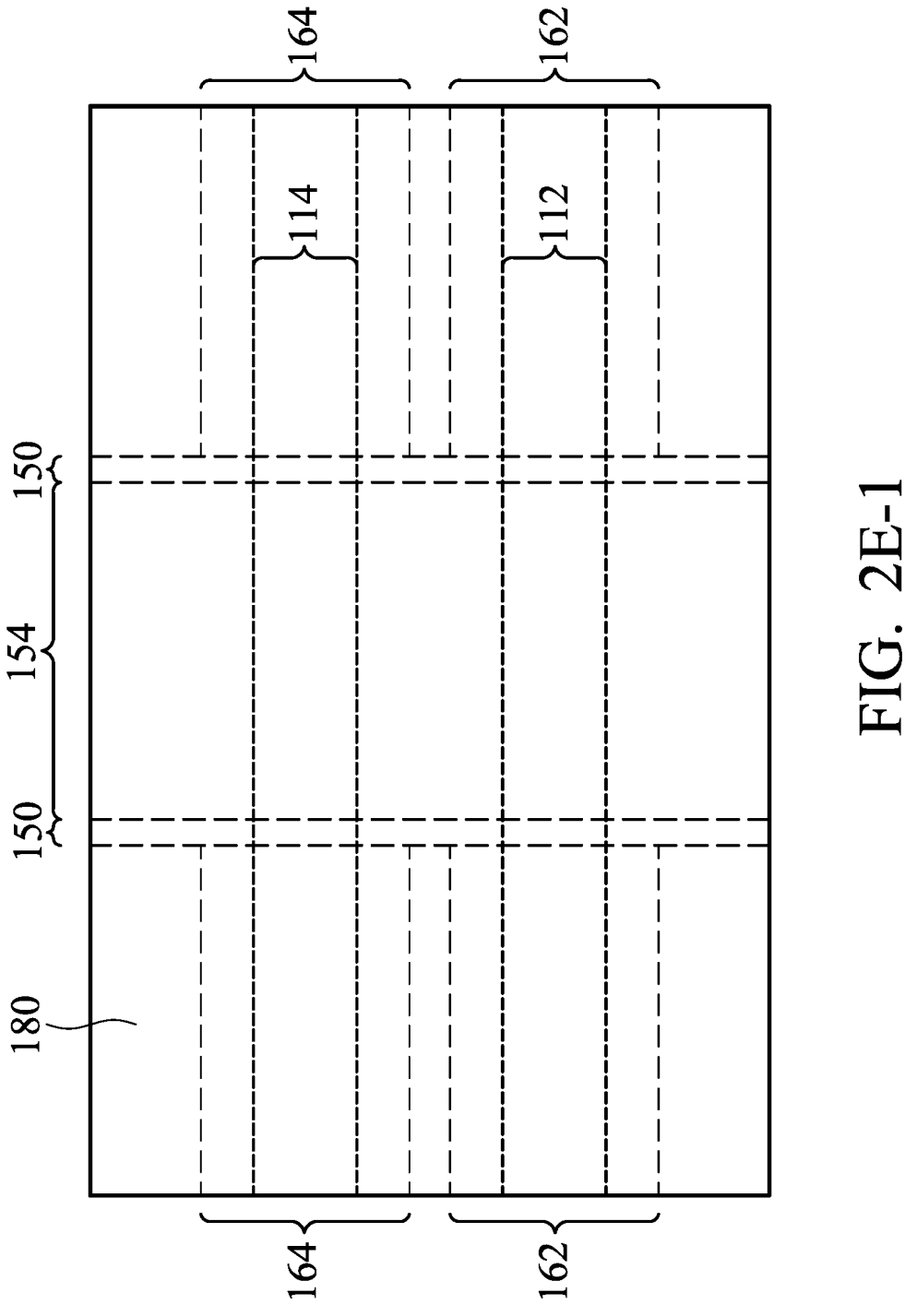

FIG. 2E-1 is a top view of the semiconductor device structure of FIG. 2E, in accordance with some embodiments. As shown in FIGS. 2E and 2E-1, a gate dielectric layer 180 is deposited over the fins 112 and 114, the isolation layer 120, which are exposed by the trench 154, the spacer layer 150, and the dielectric layer 170, in accordance with some embodiments. The gate dielectric layer 180 conformally covers the fins 112 and 114, the isolation layer 120, the spacer layer 150, and the dielectric layer 170, in accordance with some embodiments.

The gate dielectric layer 180 is made of a dielectric material, such as a high dielectric constant (high-k) material, in accordance with some embodiments. The high-k material includes metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, other suitable high-k dielectric materials, or combinations thereof, in accordance with some embodiments.

In some other embodiments, the high-k material includes metal nitrides, metal silicates, transition metal-oxides, transition metal-nitrides, transition metal-silicates, oxynitrides of metals, other suitable materials, or combinations thereof. The gate dielectric layer 180 is formed by a chemical vapor deposition (CVD) process or a physical vapor deposition (PVD) process, in accordance with some embodiments.

Figure 2F:
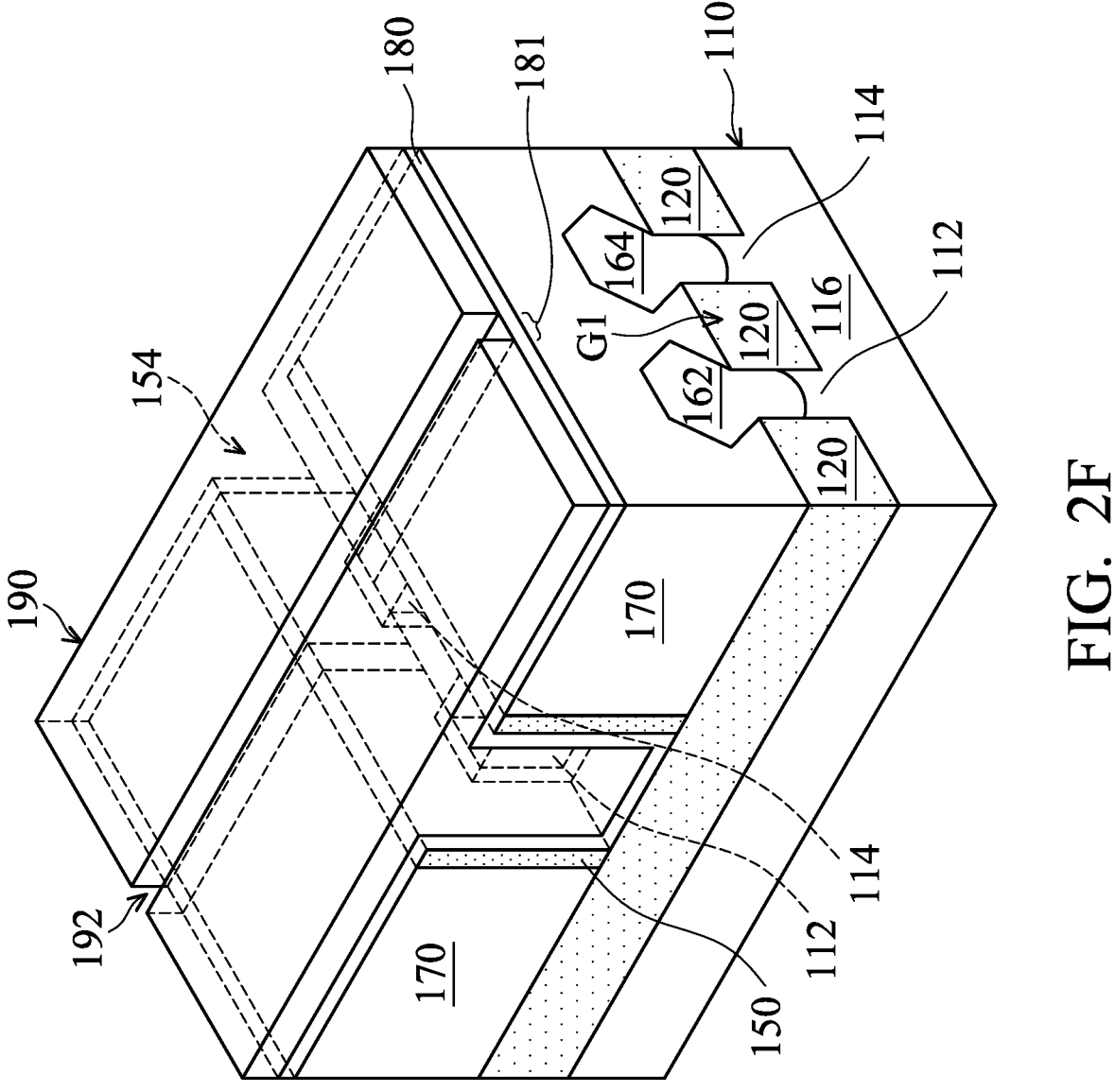
Figures 1, 2F:
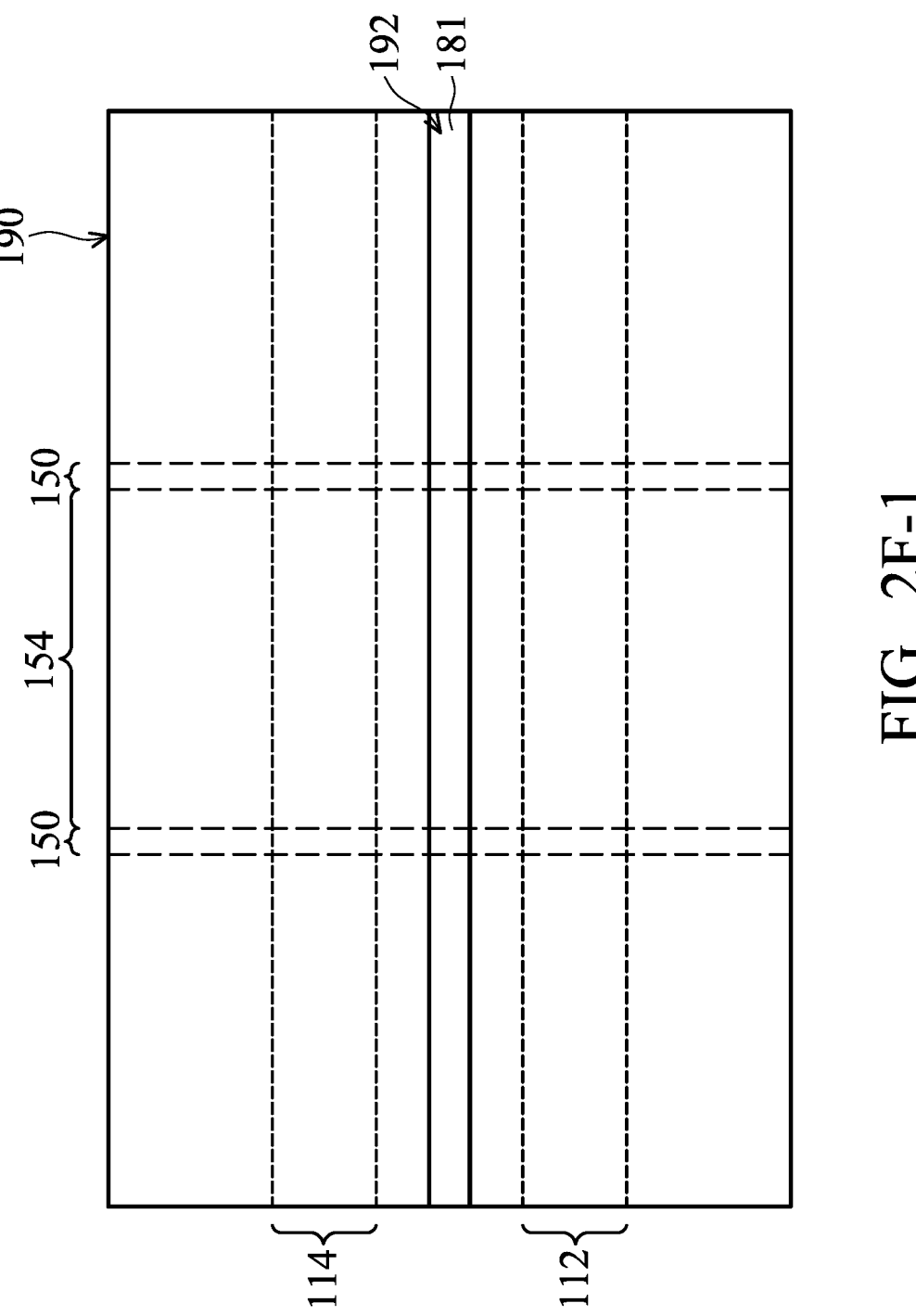

FIG. 2F-1 is a top view of the semiconductor device structure of FIG. 2F, in accordance with some embodiments. For the sake of simplicity, FIGS. 2F-1, 2G-2, and 2H-1 omit the source/drain structures 162 and 164, in accordance with some embodiments. As shown in FIGS. 2F and 2F-1, a mask layer 190 is formed over the gate dielectric layer 180, in accordance with some embodiments. The mask layer 190 has a trench 192, in accordance with some embodiments.

The trench 192 exposes a portion 181 of the gate dielectric layer 180, in accordance with some embodiments. The mask layer 190 is made of a photoresist material or another suitable material, which is different from the material of the gate dielectric layer 180, in accordance with some embodiments.

Figure 2G:
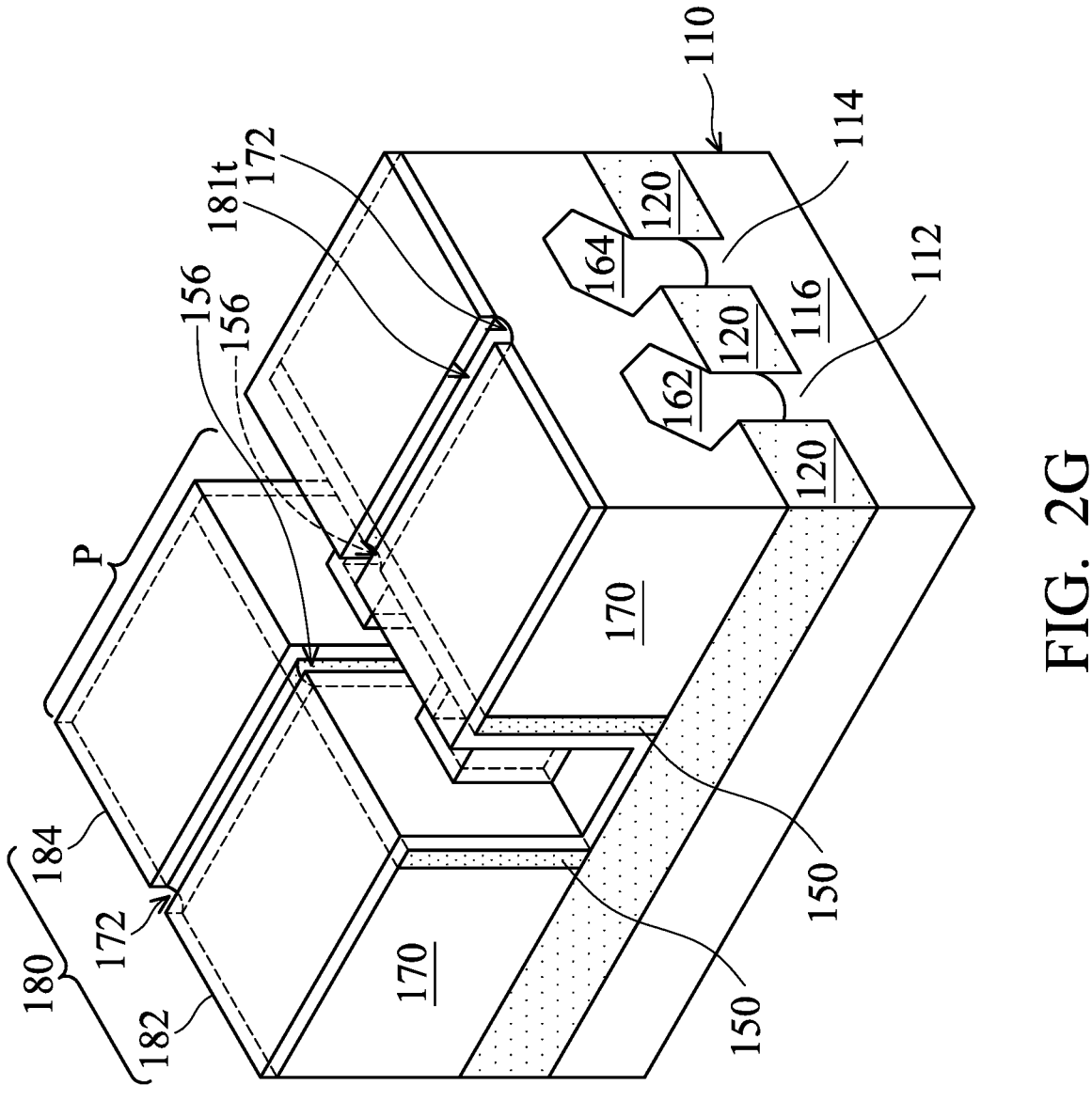
Figures 1, 2G:
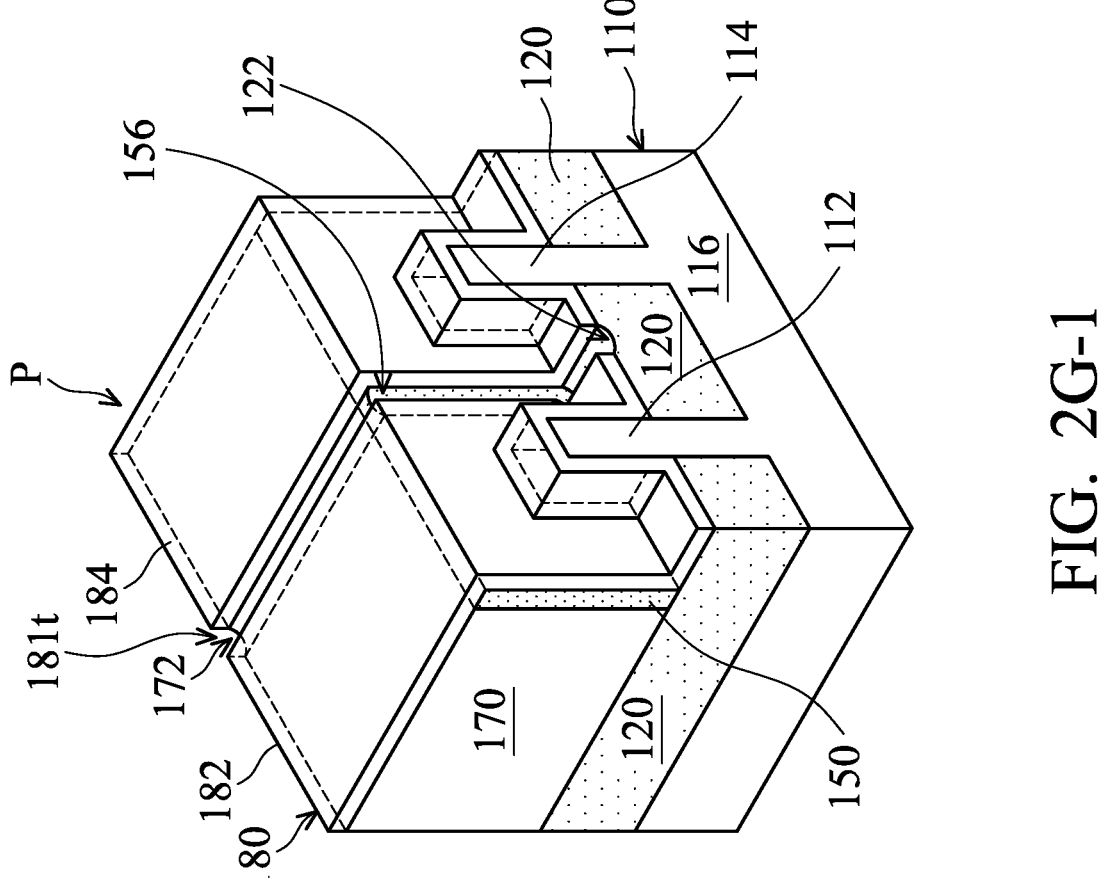
Figures 2, 2G, 3:
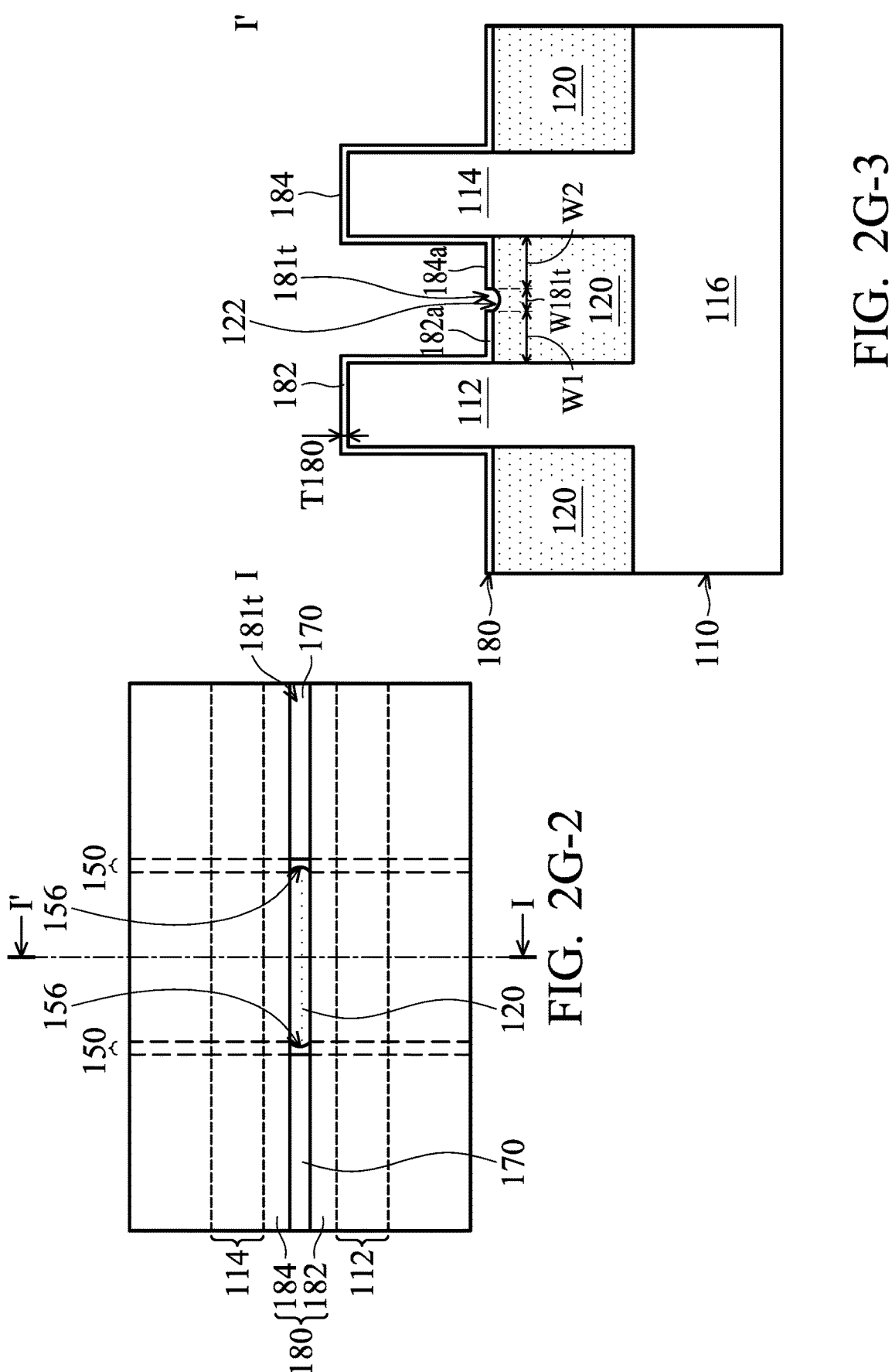

FIG. 2G-1 is a perspective view of a portion P of the semiconductor device structure of FIG. 2G, in accordance with some embodiments. FIG. 2G-2 is a top view of the semiconductor device structure of FIG. 2G, in accordance with some embodiments. FIG. 2G-3 is a cross-sectional view illustrating the semiconductor device structure along a sectional line I-I' in FIG. 2G-2, in accordance with some embodiments.

As shown in FIGS. 2F, 2G, and 2G-1, the portion 181 of the gate dielectric layer 180 is removed through the trench 192 of the mask layer 190, in accordance with some embodiments. Therefore, the removal process forms a trench 181t in the dielectric layer 180, in accordance with some embodiments.

The trench 181t exposes portions of the dielectric layer 170, the spacer layer 150, and the isolation layer 120, in accordance with some embodiments. The trench 181t is between the fins 112 and 114, in accordance with some embodiments. The gate dielectric layer 180 is divided into parts 182 and 184 by the trench 181t, in accordance with some embodiments.

In some embodiments, as shown in FIG. 2G-3, a width W181t of the trench 181t ranges from about 15 nm to about 50 nm. The part 182 has a bottom portion 182a, in accordance with some embodiments. The bottom portion 182a has a width W1, in accordance with some embodiments. The width W1 is greater than about 10 nm, in accordance with some embodiments.

The part 184 has a bottom portion 184a, in accordance with some embodiments. The bottom portion 184a has a width W2, in accordance with some embodiments. The width W2 is greater than about 10 nm, in accordance with some embodiments.

If the width W181t is greater than 50 nm, the width W1 or W2 may be too small, and therefore the property of the part 182 or 184 over the fin 112 or 114 may be affected. If the width W181t is less than 15 nm, the photolithography process and the etching process for forming the trench 181t may be hard to perform.

As shown in FIG. 2G-1, the trench 122 in the isolation layer 120 connects to the trench 156 in the spacer layer 150, in accordance with some embodiments. As shown in FIG. 2G-2, the trench 181t of the gate dielectric layer 180 has a straight strip shape, in accordance with some embodiments.

As shown in FIGS. 2G, 2G-1, 2G-2, and 2G-3, the removal process further removes portions of the dielectric layer 170, the spacer layer 150, and the isolation layer 120, in accordance with some embodiments. Therefore, the removal process forms trenches 172, 156, and 122 in the dielectric layer 170, the spacer layer 150, and the isolation layer 120 respectively, in accordance with some embodiments.

The removal process includes an etching process such as a dry etching process or a wet etching process, in accordance with some embodiments. In some other embodiments, the trenches 172, 156, and 122 are not formed. As shown in FIG. 2G, the mask layer 190 is removed, in accordance with some embodiments.

Figure 2H:
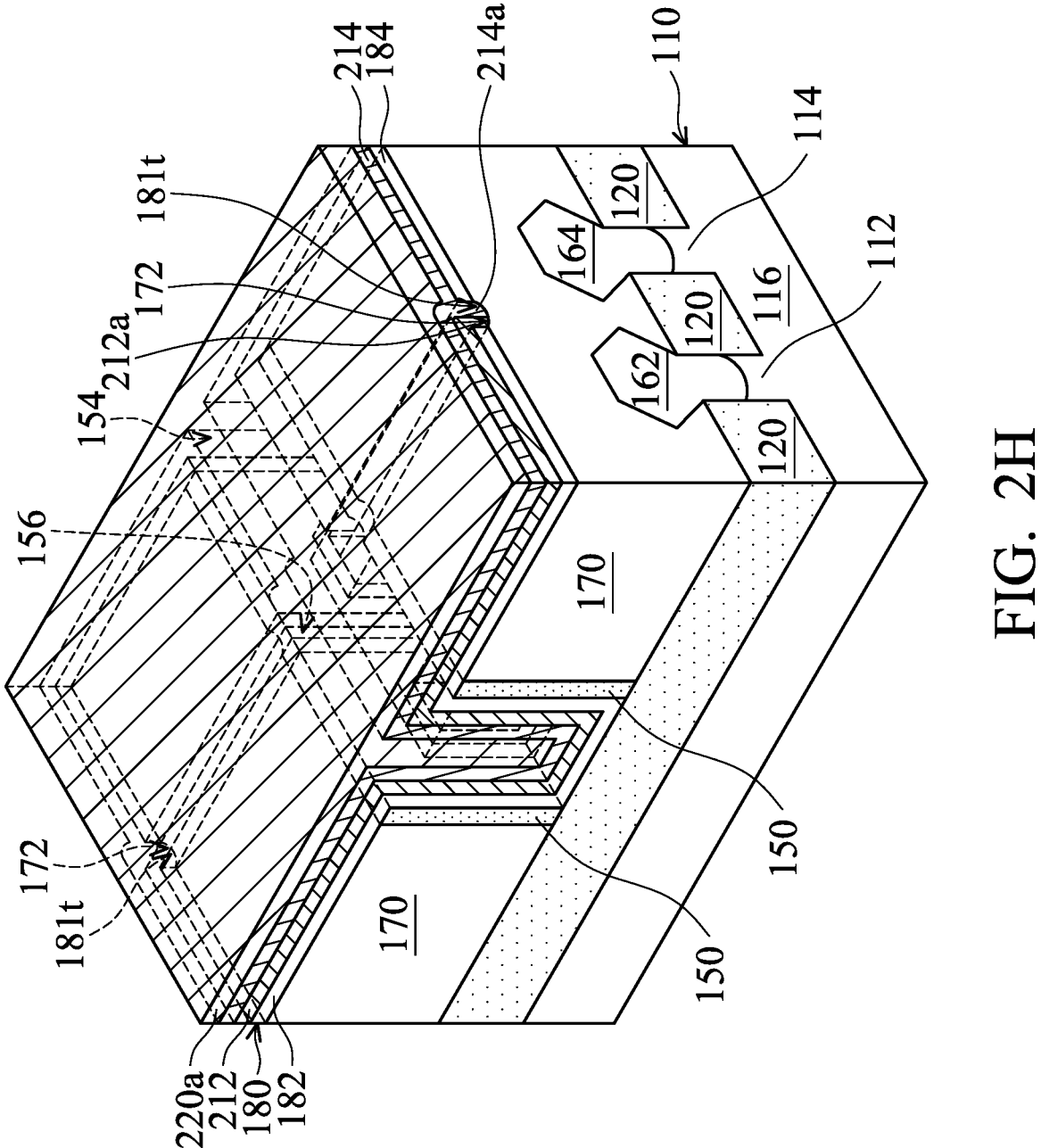
Figures 1, 2, 2H:
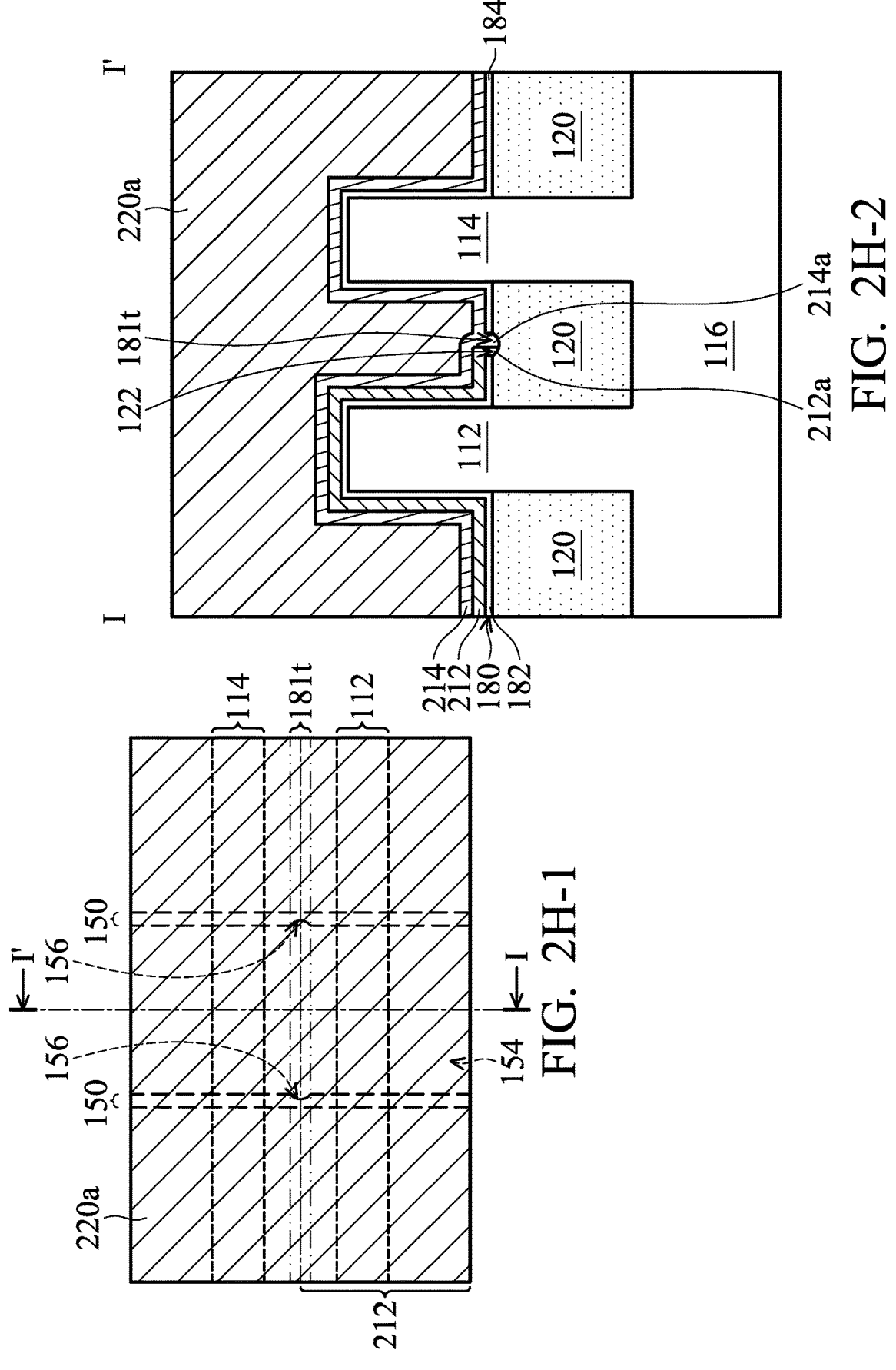

FIG. 2H-1 is a top view of the semiconductor device structure of FIG. 2H, in accordance with some embodiments. FIG. 2H-2 is a cross-sectional view illustrating the semiconductor device structure along a sectional line I-I' in FIG. 2H-1, in accordance with some embodiments.

As shown in FIGS. 2H, 2H-1, and 2H-2, a work function layer 212 is formed over the part 182 of the gate dielectric layer 180, in accordance with some embodiments. As shown in FIGS. 2H and 2H-2, a portion 212a of the work function layer 212 is in the trench 181t of the gate dielectric layer 180, in accordance with some embodiments.

As shown in FIG. 2H-2, the portion 212a of the work function layer 212 is in the trench 122 of the isolation layer 120, in accordance with some embodiments. As shown in FIG. 2H-2, the portion 212a is in direct contact with the isolation layer 120

As shown in FIGS. 2H and 2H-2, the portion 212a of the work function layer 212 is between the part 182 and the part 184, in accordance with some embodiments. As shown in FIGS. 2H and 2H-1, the portion 212a of the work function layer 212 is also in the trench 156 of the spacer layer 150, in accordance with some embodiments.

The work function layer 212 conformally covers the part 182 of the gate dielectric layer 180, in accordance with some embodiments. The work function layer 212 provides a desired work function for transistors to enhance device performance including improved threshold voltage.

In the embodiments of forming an NMOS transistor, the work function layer 212 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function layer 212 can be a p-type metal capable of providing a work function value suitable for the device, such as equal to or greater than about 4.8 eV. The p-type metal may be made of metal, metal carbide, metal nitride, other suitable materials, or a combination thereof.

For example, the p-type metal is made of titanium, titanium nitride, other suitable materials, or a combination thereof. The work function layer 212 is formed using a deposition process, a photolithography process, and an etching process, in accordance with some embodiments. The deposition process includes a physical vapor deposition (PVD) process, a CVD process, an atomic layer deposition (ALD), a plating process, another suitable method, or a combination thereof.

As shown in FIGS. 2H, 2H-1, and 2H-2, a work function layer 214 is formed over the part 184 of the gate dielectric layer 180 and the work function layer 212, in accordance with some embodiments. As shown in FIGS. 2H and 2H-2, a portion 214a of the work function layer 214 is in the trench 181t of the gate dielectric layer 180, in accordance with some embodiments.

As shown in FIGS. 2H and 2H-2, the portion 214a of the work function layer 214 is between the parts 182 and 184, in accordance with some embodiments. As shown in FIG. 2H-2, the portion 214a of the work function layer 214 is in direct contact with the isolation layer 120, in accordance with some embodiments.

The work function layer 214 conformally covers the work function layer 212 and the part 184 of the gate dielectric layer 180, in accordance with some embodiments. The work function layers 212 and 214 are made of different materials, in accordance with some embodiments. The work function layer 214 provides a desired work function for transistors to enhance device performance including improved threshold voltage.

In the embodiments of forming an NMOS transistor, the work function layer 214 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function layer 214 can be a p-type metal capable of providing a work function value suitable for the device, such as equal to or greater than about 4.8 eV. The p-type metal may be made of metal, metal carbide, metal nitride, other suitable materials, or a combination thereof.

For example, the p-type metal is made of titanium, titanium nitride, other suitable materials, or a combination thereof. The work function layer 214 is formed using a deposition process, a photolithography process, and an etching process, in accordance with some embodiments. The deposition process includes a physical vapor deposition (PVD) process, a CVD process, an atomic layer deposition (ALD), a plating process, another suitable method, or a combination thereof.

Thereafter, as shown in FIGS. 2H, 2H-1, and 2H-2, a gate electrode layer 220a (also called a metal gate electrode layer) is deposited over the work function layer 214 to fill the trench 154 of the spacer layer 150, in accordance with some embodiments.

The gate electrode layer 220a are made of a suitable metal material, such as aluminum, tungsten, gold, platinum, cobalt, another suitable metal, an alloy thereof, or a combination thereof, in accordance with some embodiments.

Figure 2I:
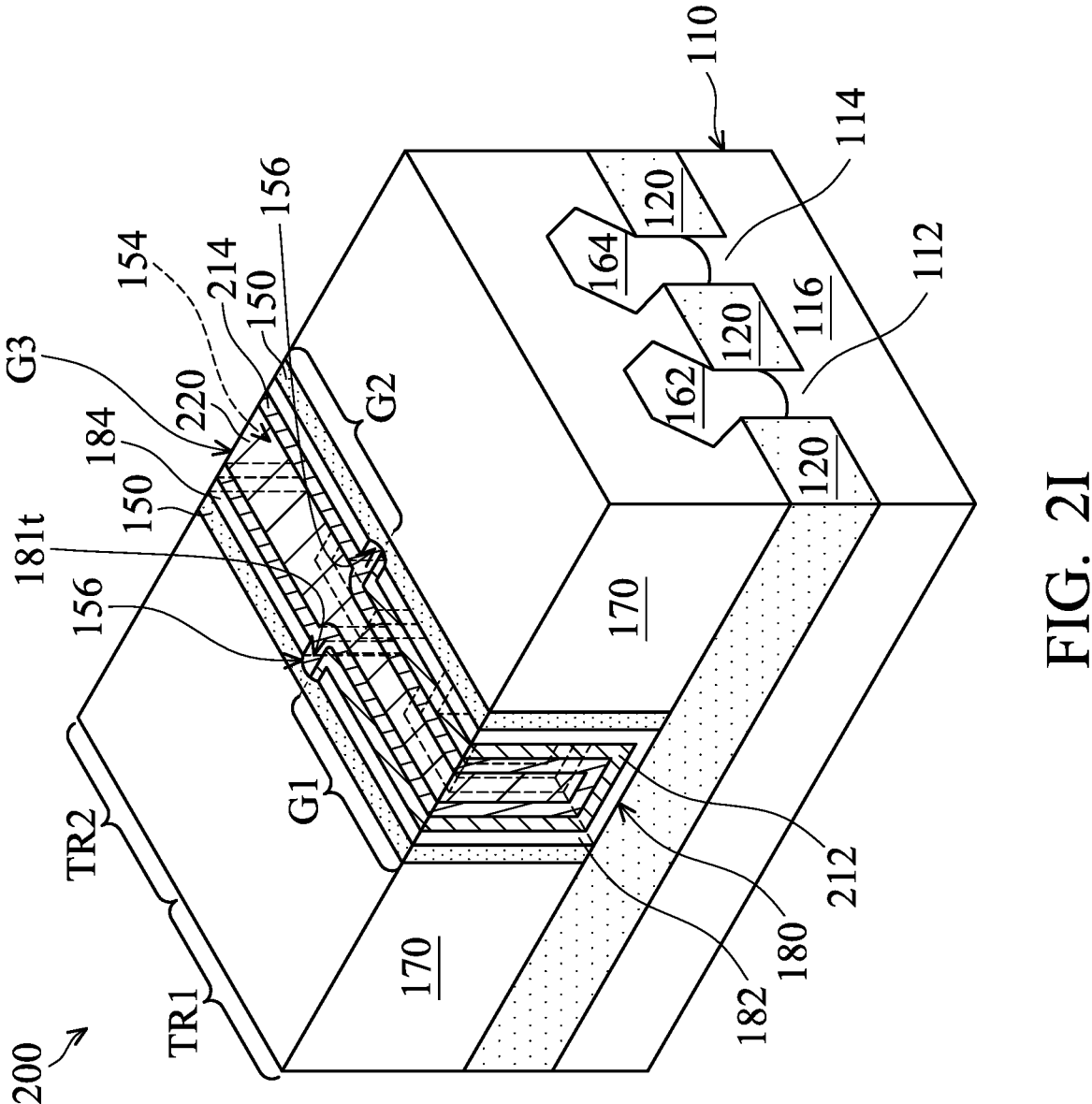
Figures 1, 2, 2I:
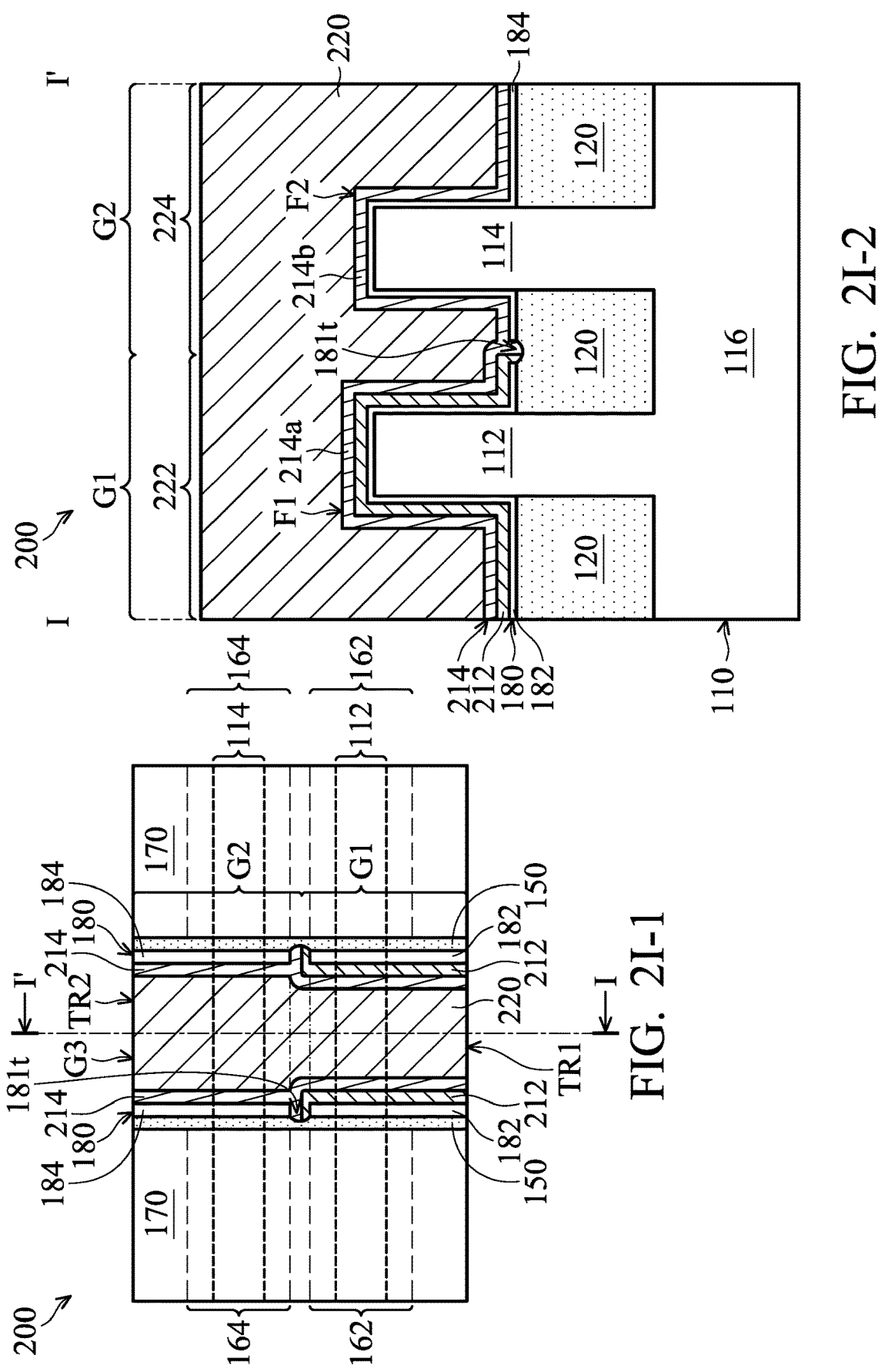

FIG. 2I-1 is a top view of the semiconductor device structure of FIG. 2I, in accordance with some embodiments. FIG. 2I-2 is a cross-sectional view illustrating the semiconductor device structure along a sectional line I-I' in FIG. 2I-1, in accordance with some embodiments.

Thereafter, as shown in FIGS. 2H, 2I, 2I-1, and 2I-2, portions of the gate dielectric layer 180, the gate electrode layer 220a, and the work function layers 212 and 214 outside of the trench 154 of the spacer layer 150 are removed, in accordance with some embodiments. The removal process includes a planarization process, in accordance with some embodiments.

As shown in FIGS. 2I, 2I-1, and 2I-2, the remaining gate electrode layer 220a forms a gate electrode 220, in accordance with some embodiments. As shown in FIG. 2I-2, the work function layer 212 and a left portion 214a of the work function layer 214 together form a work function structure F1, in accordance with some embodiments.

As shown in FIG. 2I-2, a left portion 222 of the gate electrode 220, the work function structure F1, and the part 182 of the gate dielectric layer 180 together form a gate stack G1, in accordance with some embodiments. As shown in FIGS. 2I and 2I-1, the gate stack G1 and the source/drain structures 162 together form a transistor TR1, in accordance with some embodiments. The transistor TR1 includes a p-channel field effect transistor (PFET) or an n-channel field effect transistor (NFET), in accordance with some embodiments.

As shown in FIG. 2I-2, a right portion 214b of the work function layer 214 forms a work function structure F2, in accordance with some embodiments. As shown in FIG. 2I-2, a right portion 224 of the gate electrode 220, the work function structure F2, and the part 184 of the gate dielectric layer 180 together form a gate stack G2, in accordance with some embodiments.

As shown in FIGS. 2I and 2I-1, the gate stack G2 and the source/drain structures 164 together form a transistor TR2, in accordance with some embodiments. The transistor TR2 includes a p-channel field effect transistor (PFET) or an n-channel field effect transistor (NFET), in accordance with some embodiments. The gate stacks G1 and G2 together form a gate stack G3, in accordance with some embodiments.

In this step, a semiconductor device structure 200 is substantially formed, in accordance with some embodiments. The semiconductor device structure 200 includes a complementary metal-oxide-semiconductor (CMOS) device, in accordance with some embodiments. The semiconductor device structure 200 includes a logic device or a static random access memory (SRAM) device, in accordance with some embodiments.

Since a metal atom concentration of the work function structure F1 is different from that of the work function structure F2, the metal atoms in the work function structures F1 and F2 may cross diffuse, which may lead to a threshold voltage shift of the transistors TR1 and TR2 (hereinafter this effect is referred to as the metal boundary effect (MBE)), in accordance with some embodiments.

Since the gate dielectric layer 180 is one of the metal atom diffusion paths between the transistors TR1 and TR2, the trench 181*t* in the dielectric layer 180 and between the transistors TR1 and TR2 may cut off this metal atom diffusion path.

Therefore, the trench 181*t* may reduce the metal boundary effect. Therefore, the performance of the transistors TR1 and TR2 (or the semiconductor device structure 200) is improved, in accordance with some embodiments.

Figure 3A:
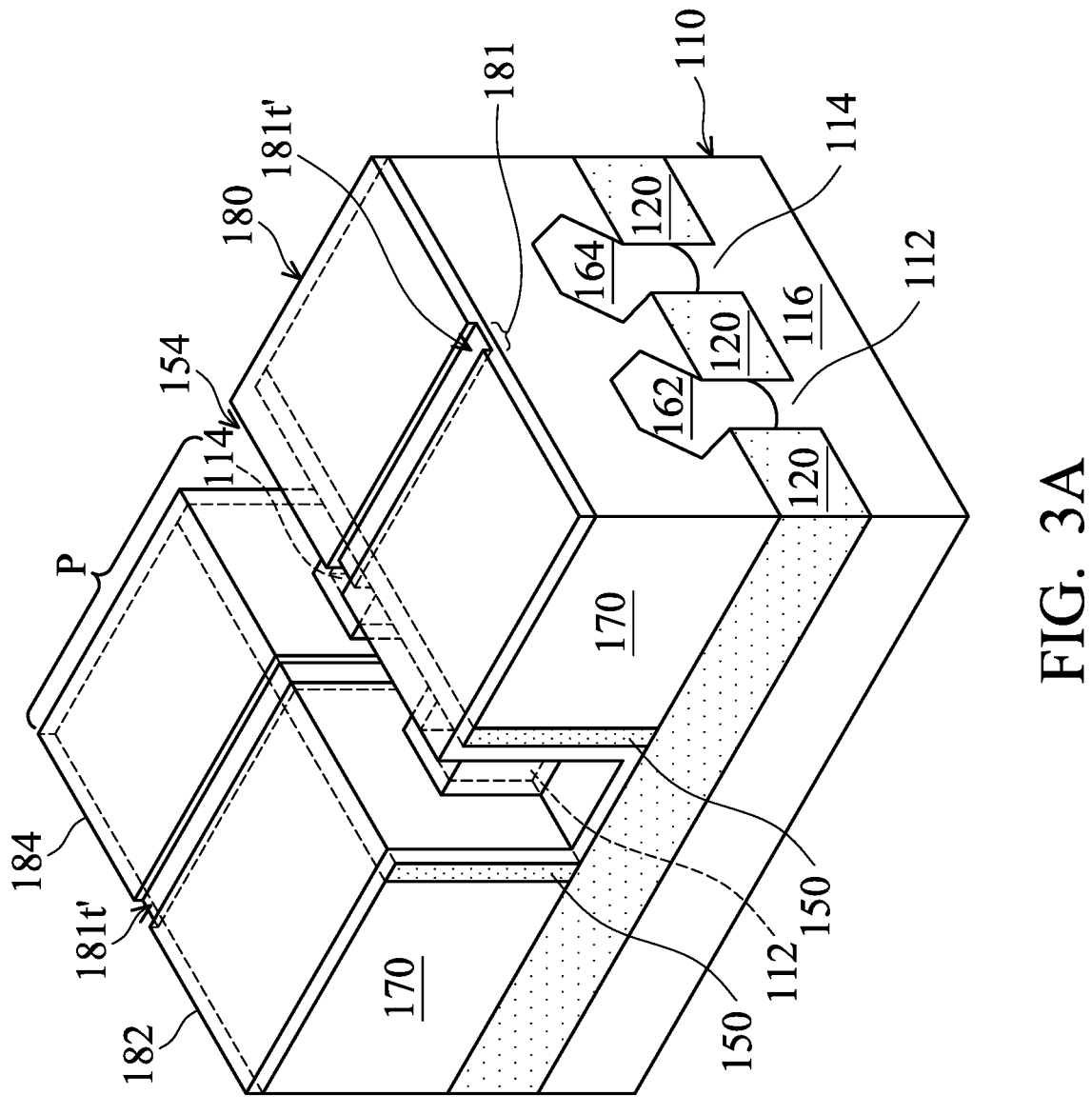
FIGS. 3A-3B are perspective views of various stages of a process for forming a semiconductor device structure, in accordance with some embodiments.
Figures 1, 3A:
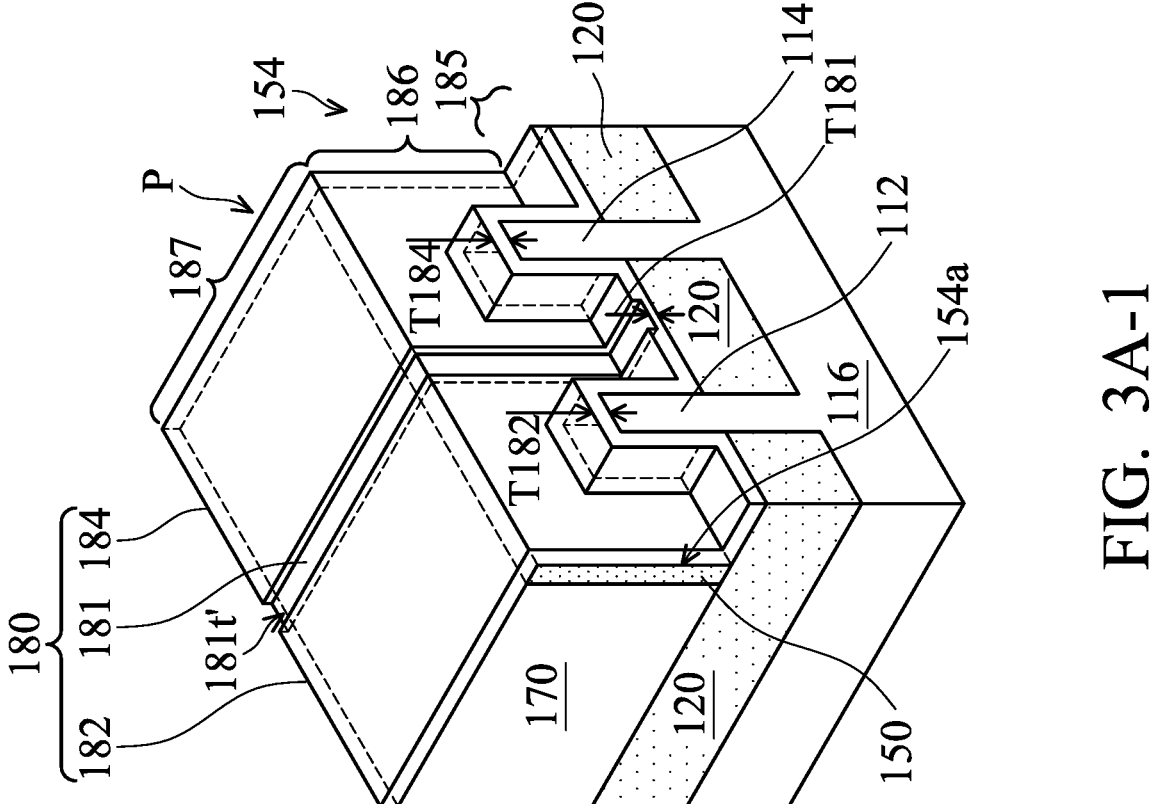
Figures 2, 3, 3A:
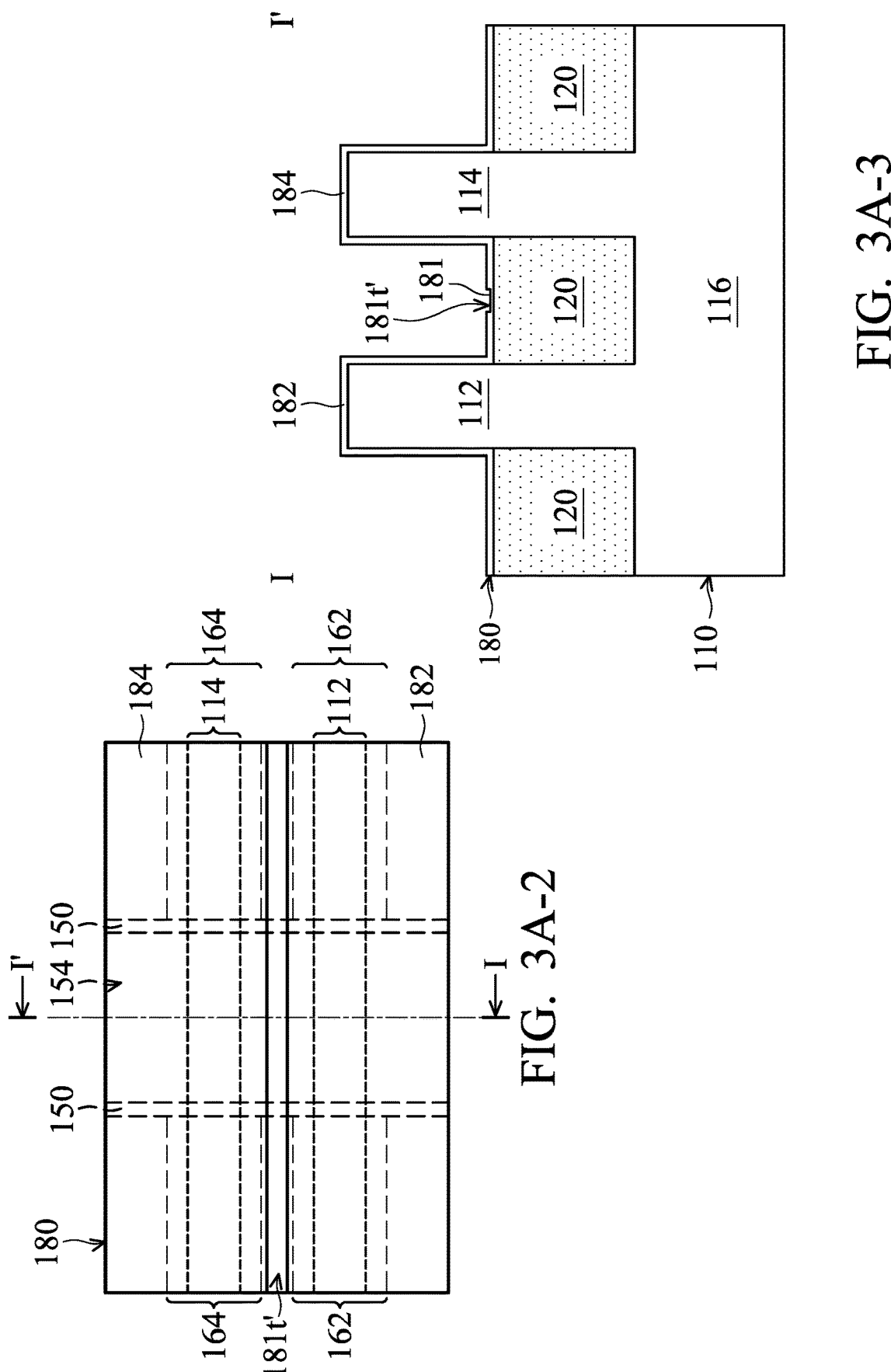
Figure 3B:
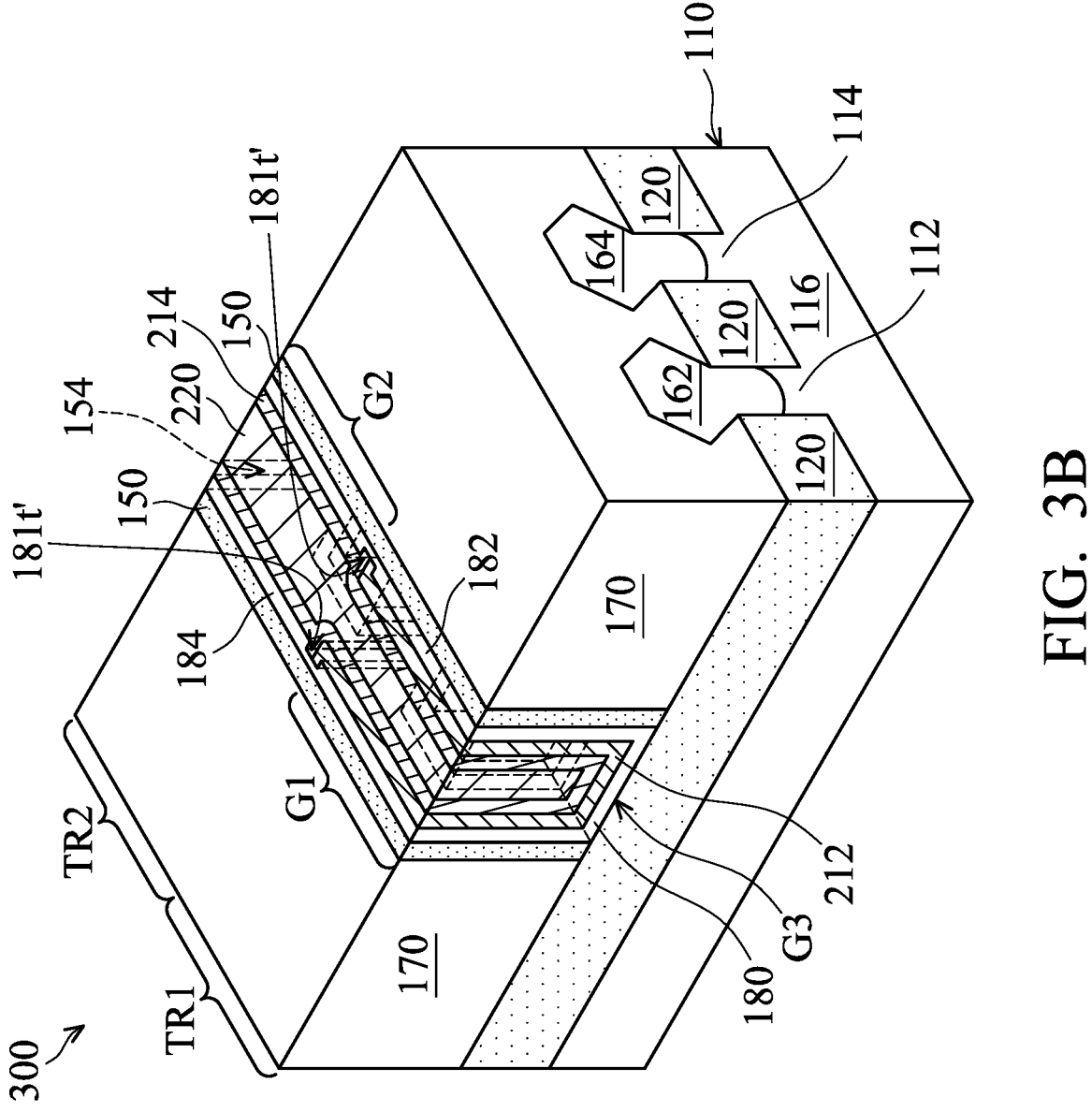
Figures 1, 2, 3B:
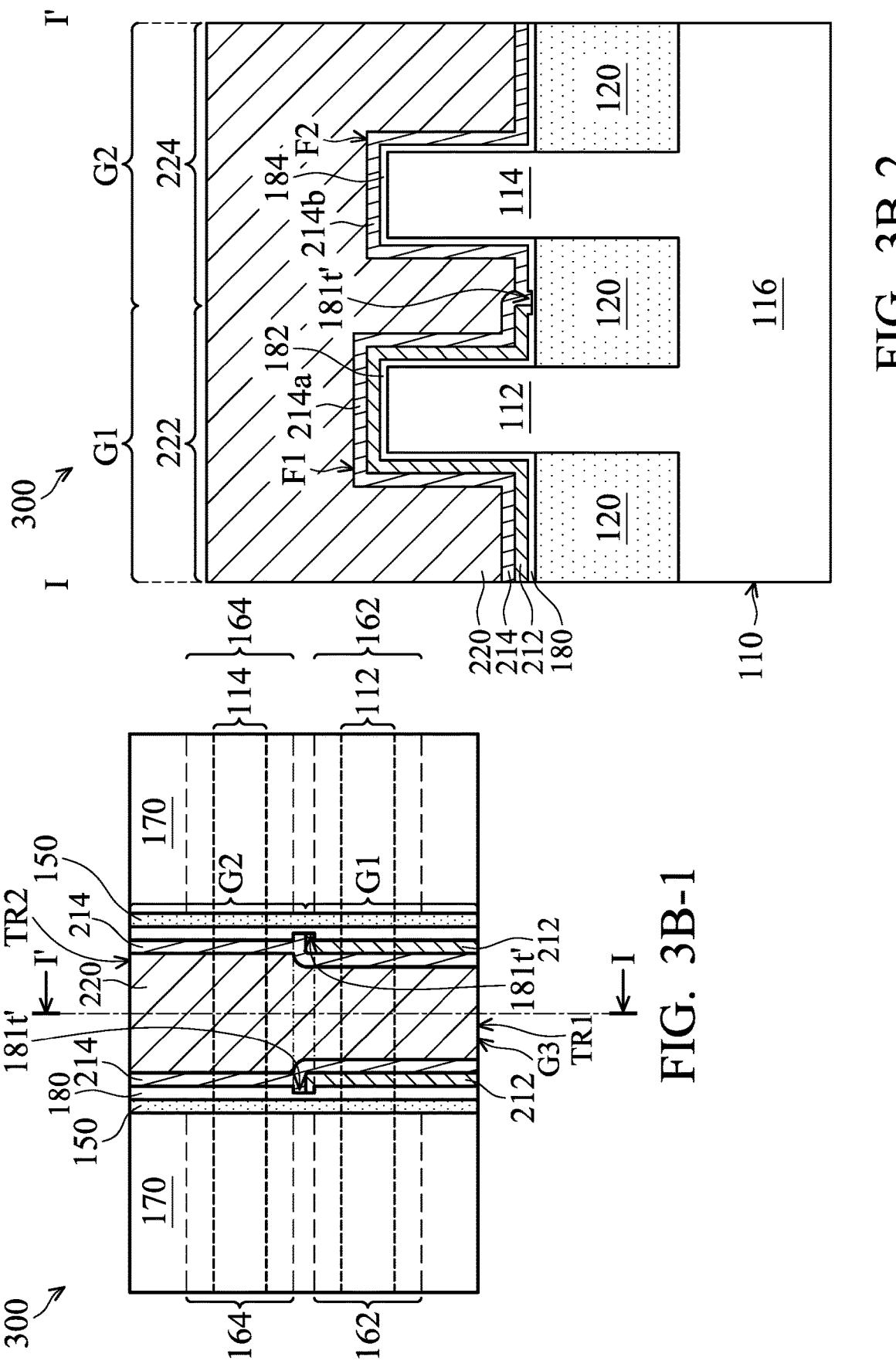

FIGS. 3A-3B are perspective views of various stages of a process for forming a semiconductor device structure, in accordance with some embodiments. FIG. 3A-1 is a perspective view of a portion P of the semiconductor device structure of FIG. 3A, in accordance with some embodiments.

FIG. 3A-2 is a top view of the semiconductor device structure of FIG. 3A, in accordance with some embodiments. FIG. 3A-3 is a cross-sectional view illustrating the semiconductor device structure along a sectional line I-I' in FIG. 3A-2, in accordance with some embodiments.

As shown in FIGS. 2F, 3A, and 3A-1, after the step of FIG. 2F is performed, the portion 181 of the gate dielectric layer 180 is partially removed through the trench 192 of the mask layer 190, in accordance with some embodiments. Therefore, the removal process forms a trench 181*t*' in the dielectric layer 180, in accordance with some embodiments. The portion 181 is thinned by the removal process, in accordance with some embodiments. As shown in FIG. 3A, the mask layer 190 is removed, in accordance with some embodiments.

As shown in FIGS. 3A-1, 3A-2, and 3A-3, the trench 181*t*' is between the fins 112 and 114, in accordance with some embodiments. The gate dielectric layer 180 has parts 182 and 184, in accordance with some embodiments. The trench 181*t*' is between the parts 182 and 184, in accordance with some embodiments.

The portion 181 under the trench 181*t*' is thinner than the part 182, in accordance with some embodiments. That is, as shown in FIG. 3A-1, the thickness T181 of the portion 181 is less than the thickness T182 of the part 182, in accordance with some embodiments. The thickness T182 of the part 182 ranges from about 0.5 nm to about 5 nm, in accordance with some embodiments.

In some embodiments, a ratio of the thickness T181 to the thickness T182 ranges from about 0.1 to about 0.9. If the ratio of the thickness T181 to the thickness T182 is greater than 0.9, the trench 181*t*' is too shallow to reduce the metal boundary effect, in accordance with some embodiments.

The portion 181 is thinner than the part 184, in accordance with some embodiments. That is, as shown in FIG. 3A-1, the thickness T181 of the portion 181 is less than the thickness T184 of the part 184, in accordance with some embodiments. The thickness T184 of the part 184 ranges from about 0.5 nm to about 5 nm, in accordance with some embodiments.

In some embodiments, a ratio of the thickness T181 to the thickness T184 ranges from about 0.1 to about 0.9. If the ratio of the thickness T181 to the thickness T184 is greater than 0.9, the trench 181*t*' is too shallow to reduce the metal boundary effect, in accordance with some embodiments.

As shown in FIG. 3A-1, the gate dielectric layer 180 has a bottom portion 185, a sidewall portion 186, and a top portion 187, in accordance with some embodiments. The bottom portion 185 covers the isolation layer 120 and the fins 112 and 114, in accordance with some embodiments. The sidewall portion 186 covers inner walls 154*a* of the trench 154 of the spacer layer 150, in accordance with some embodiments.

The top portion 187 is over the dielectric layer 170 and the spacer layer 150, in accordance with some embodiments. The trench 181*t*' is in the bottom portion 185, the sidewall portion 186, and the top portion 187, in accordance with some embodiments. The trench 181*t*' is a continuous trench, in accordance with some embodiments.

FIG. 3B-1 is a top view of the semiconductor device structure of FIG. 3B, in accordance with some embodiments. FIG. 3B-2 is a cross-sectional view illustrating the semiconductor device structure along a sectional line I-I' in FIG. 3B-1, in accordance with some embodiments.

As shown in FIGS. 3B, 3B-1, and 3B-2, the steps of FIGS. 2H-2I are performed to form the work function layers 212 and 214 and the gate electrode 220, in accordance with some embodiments. The work function layer 212 is formed over the part 182 of the gate dielectric layer 180, in accordance with some embodiments.

The work function layer 214 is formed over the part 184 of the gate dielectric layer 180 and the work function layer 212, in accordance with some embodiments. The gate electrode 220 is formed over the work function layer 214 to fill the trench 154 of the spacer layer 150, in accordance with some embodiments.

As shown in FIG. 3B-2, the work function layer 212 and a left portion 214*a* of the work function layer 214 together form a work function structure F1, in accordance with some embodiments. As shown in FIG. 3B-2, a left portion 222 of the gate electrode 220, the work function structure F1, and the part 182 of the gate dielectric layer 180 together form a gate stack G1, in accordance with some embodiments. As shown in FIGS. 3B and 3B-1, the gate stack G1 and the source/drain structures 162 together form a transistor TR1, in accordance with some embodiments.

As shown in FIG. 3B-2, a right portion 214*b* of the work function layer 214 forms a work function structure F2, in accordance with some embodiments. As shown in FIG. 3B-2, a right portion 224 of the gate electrode 220, the work function structure F2, and the part 184 of the gate dielectric layer 180 together form a gate stack G2, in accordance with some embodiments.

As shown in FIGS. 3B and 3B-1, the gate stack G2 and the source/drain structures 164 together form a transistor TR2, in accordance with some embodiments. The gate stacks G1 and G2 together form a gate stack G3, in accordance with some embodiments. In this step, a semiconductor device structure 300 is substantially formed, in accordance with some embodiments.

Since the gate dielectric layer 180 is one of the metal atom diffusion paths between the transistors TR1 and TR2, the trench 181*t*' in the dielectric layer 180 and between the transistors TR1 and TR2 may narrow this metal atom diffusion path.

Therefore, the trench 181*t*' may reduce the metal boundary effect. Therefore, the performance of the transistors TR1 and TR2 (or the semiconductor device structure 300) is improved, in accordance with some embodiments.

Figures 1, 4A:
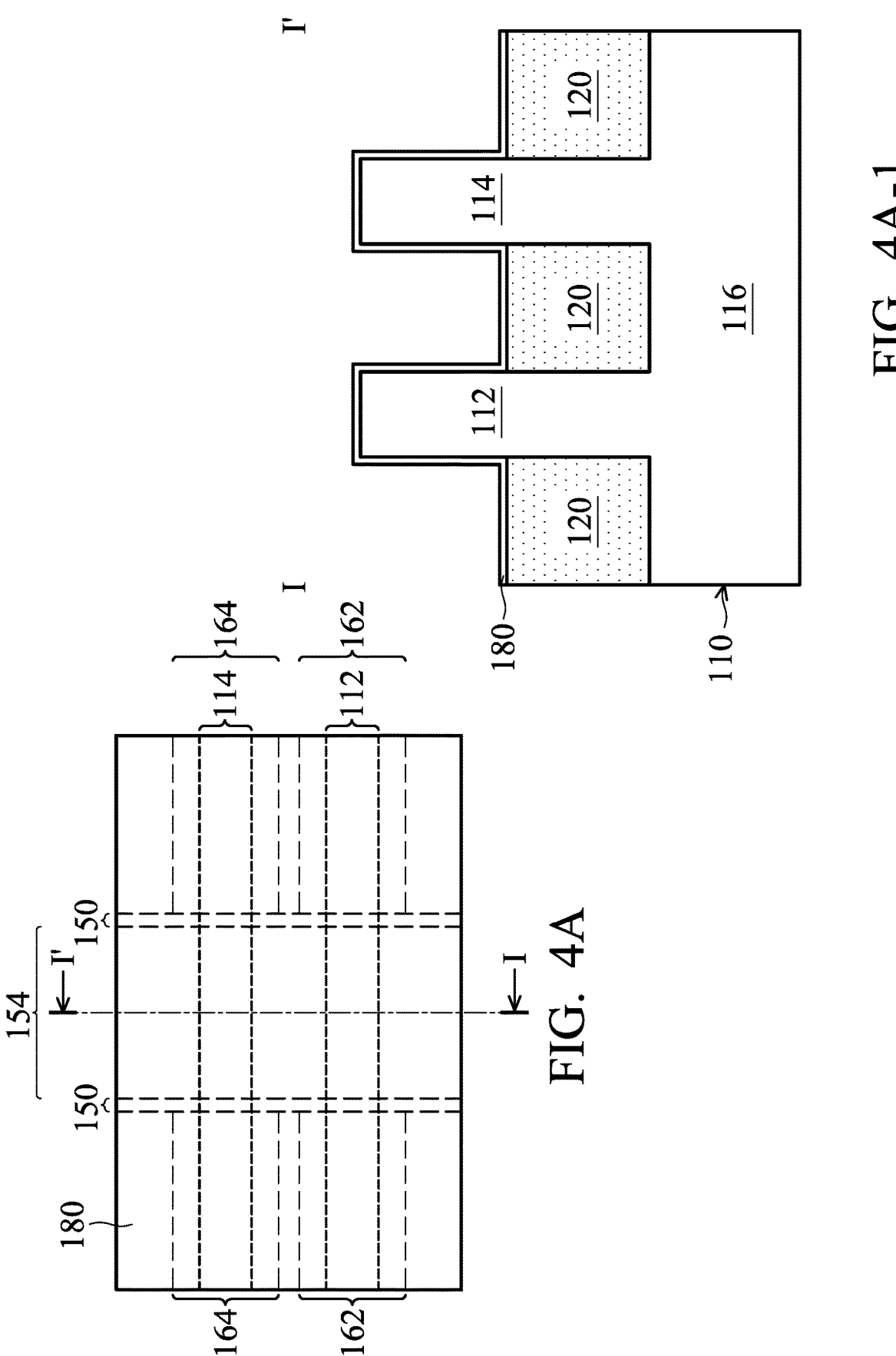
Figures 2, 4A:
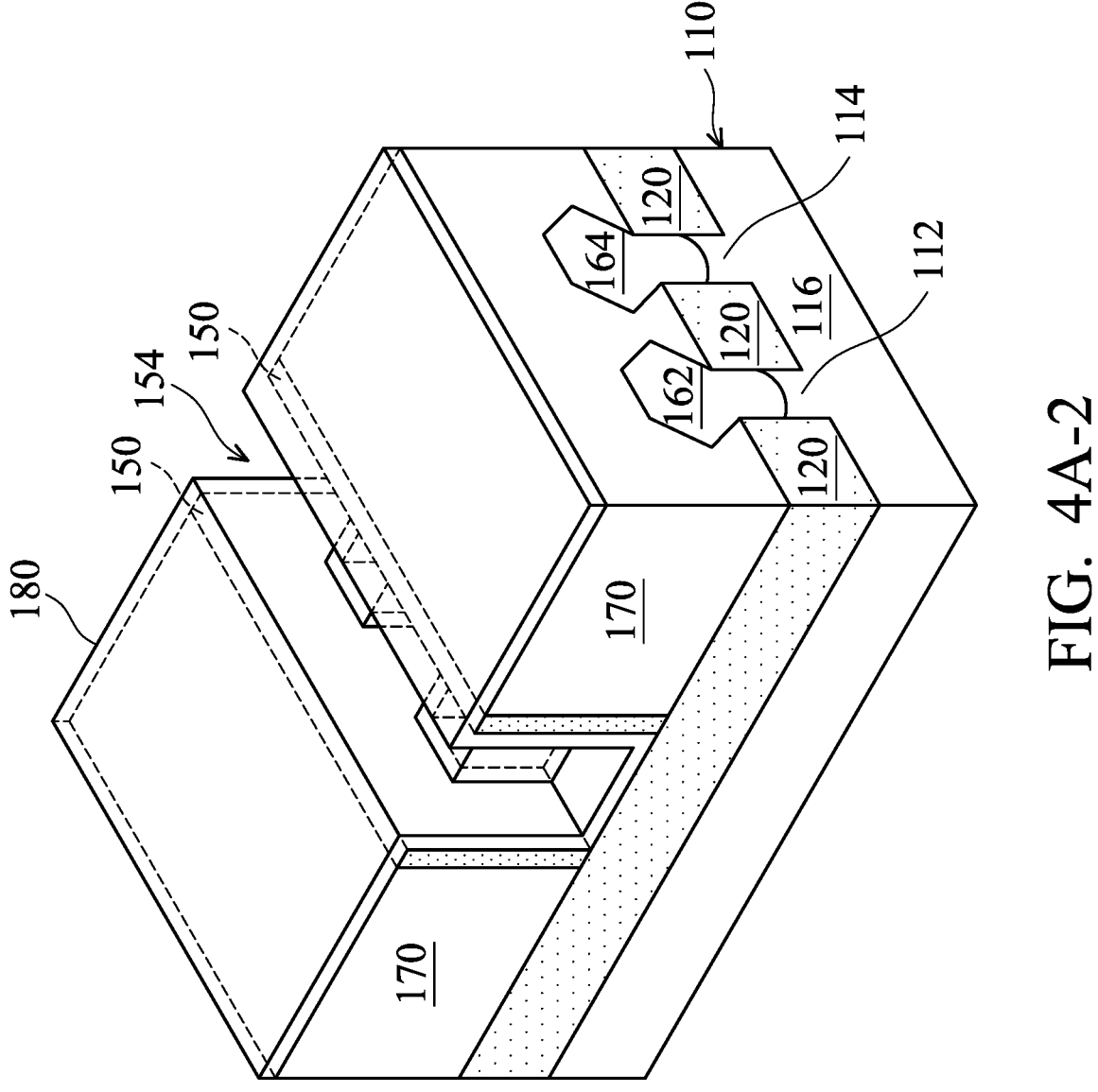
Figures 1, 4B:
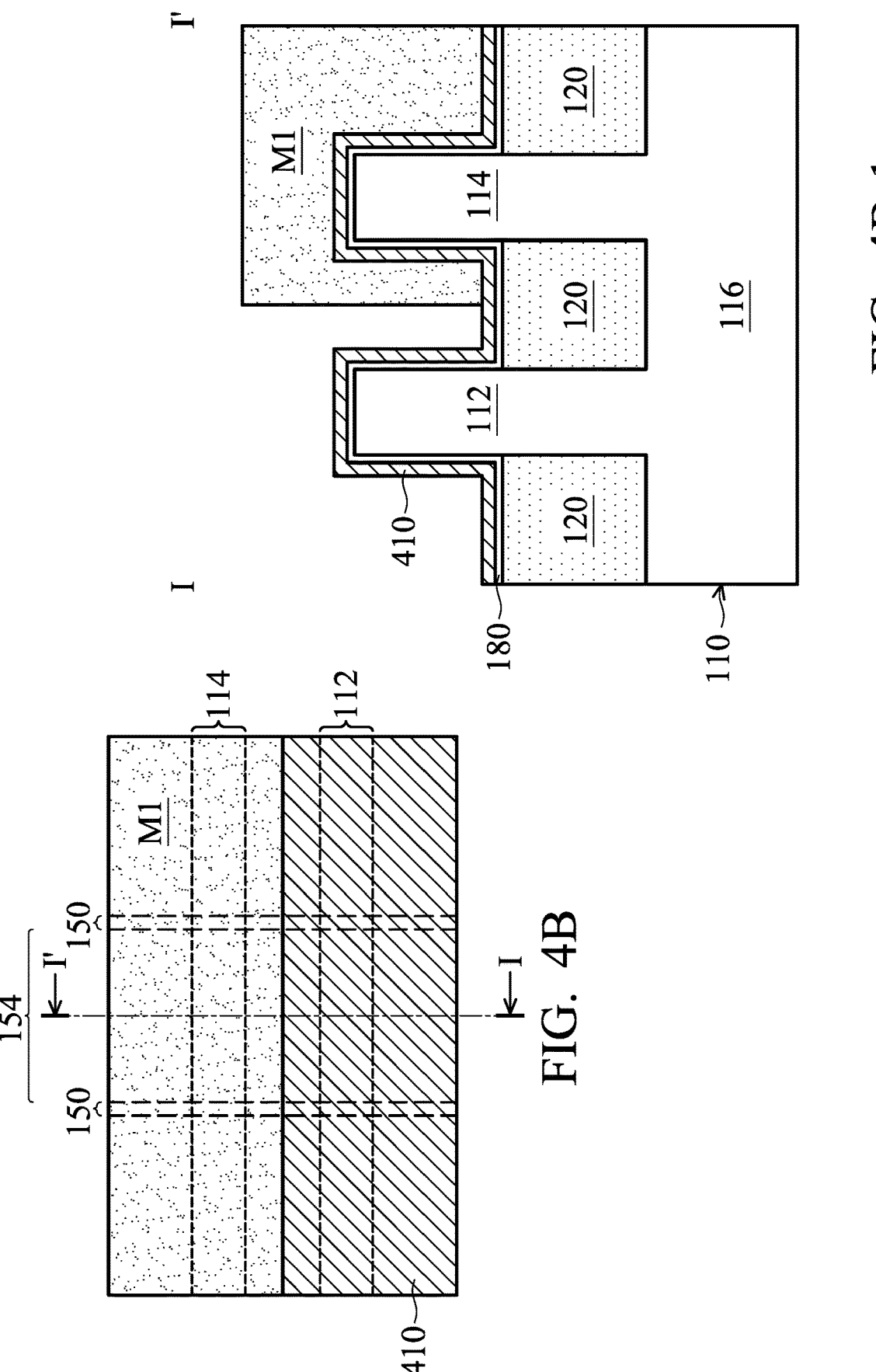
Figures 1, 4C:
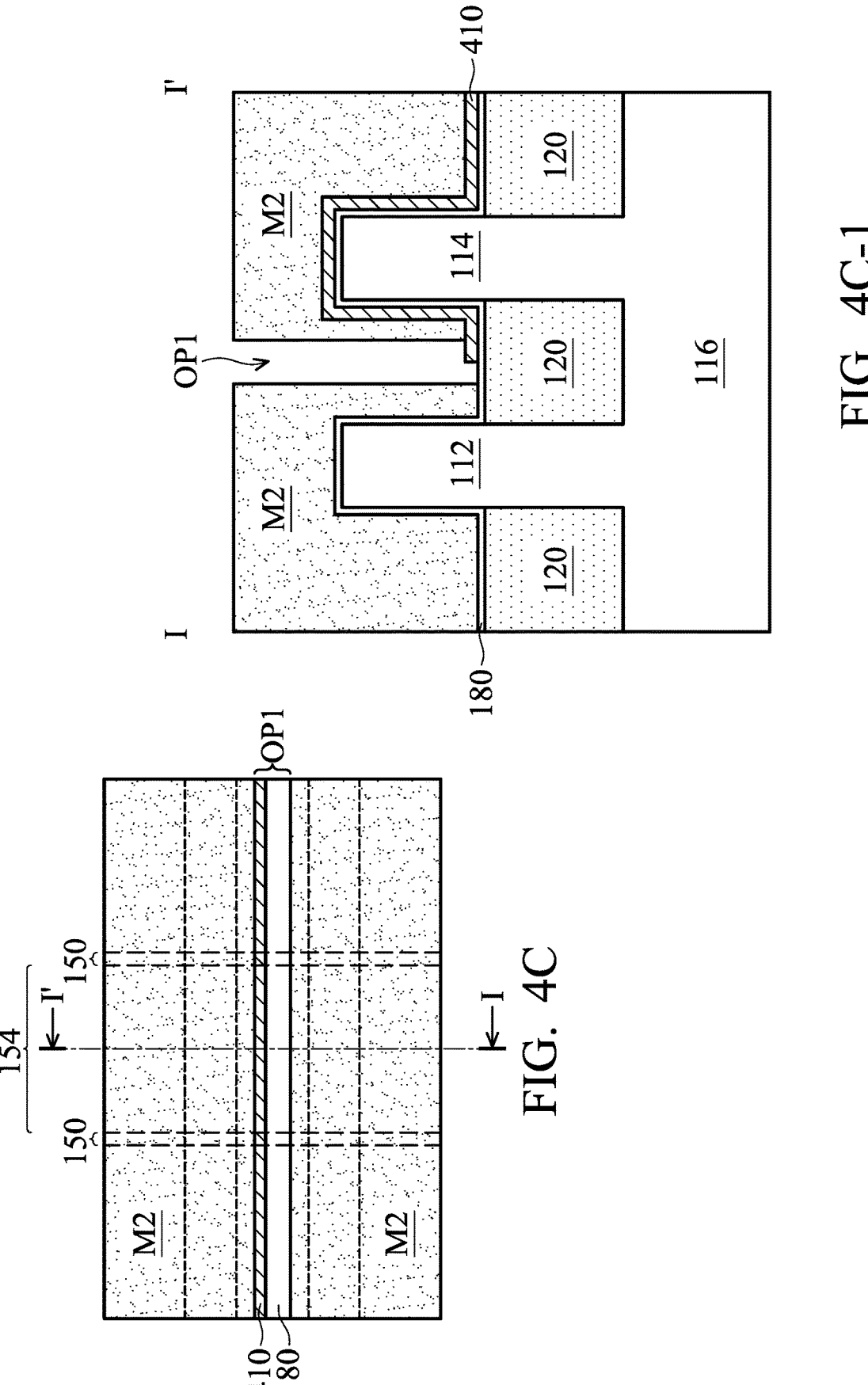
Figures 1, 4D:
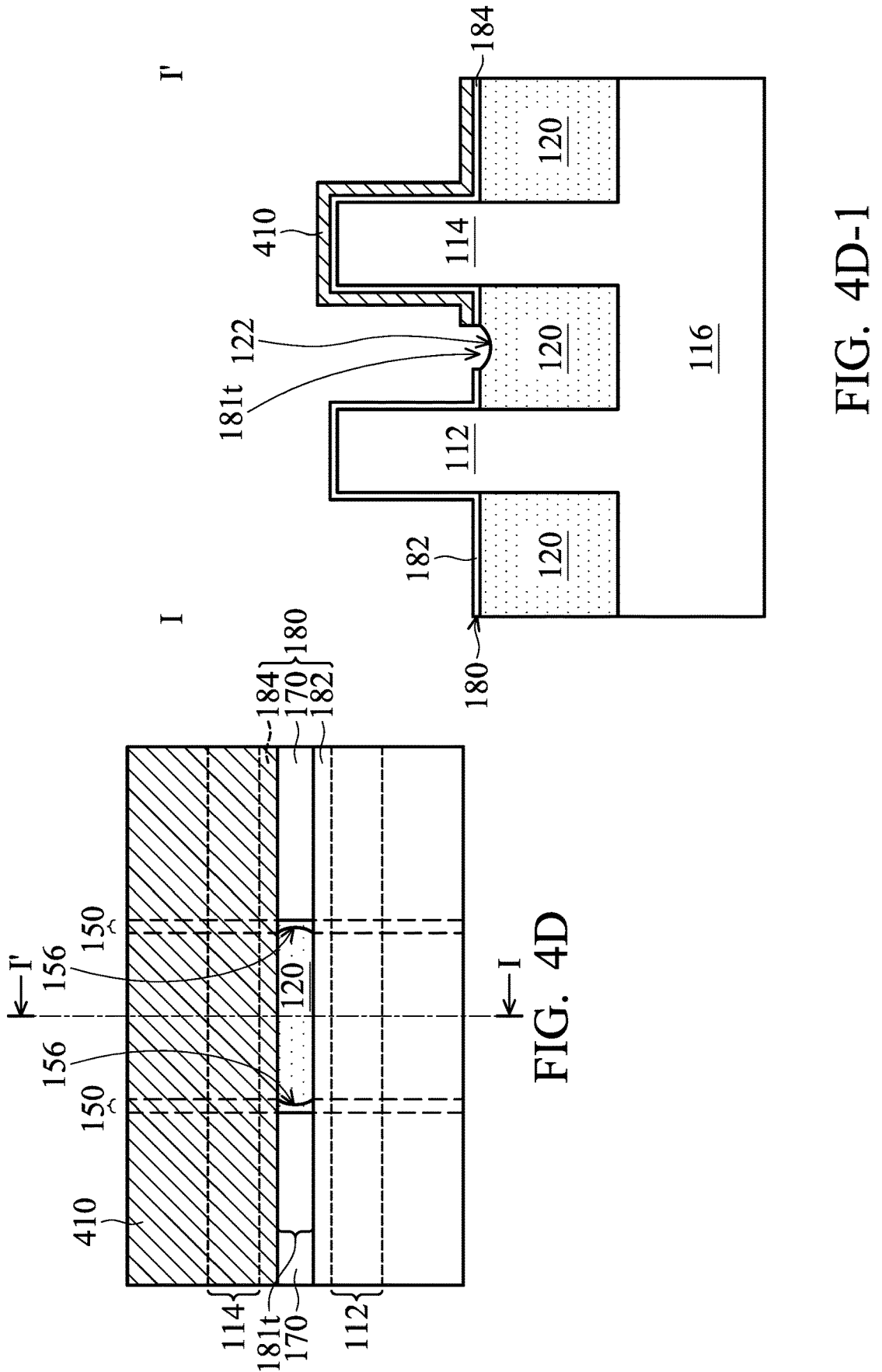
Figures 1, 4E:
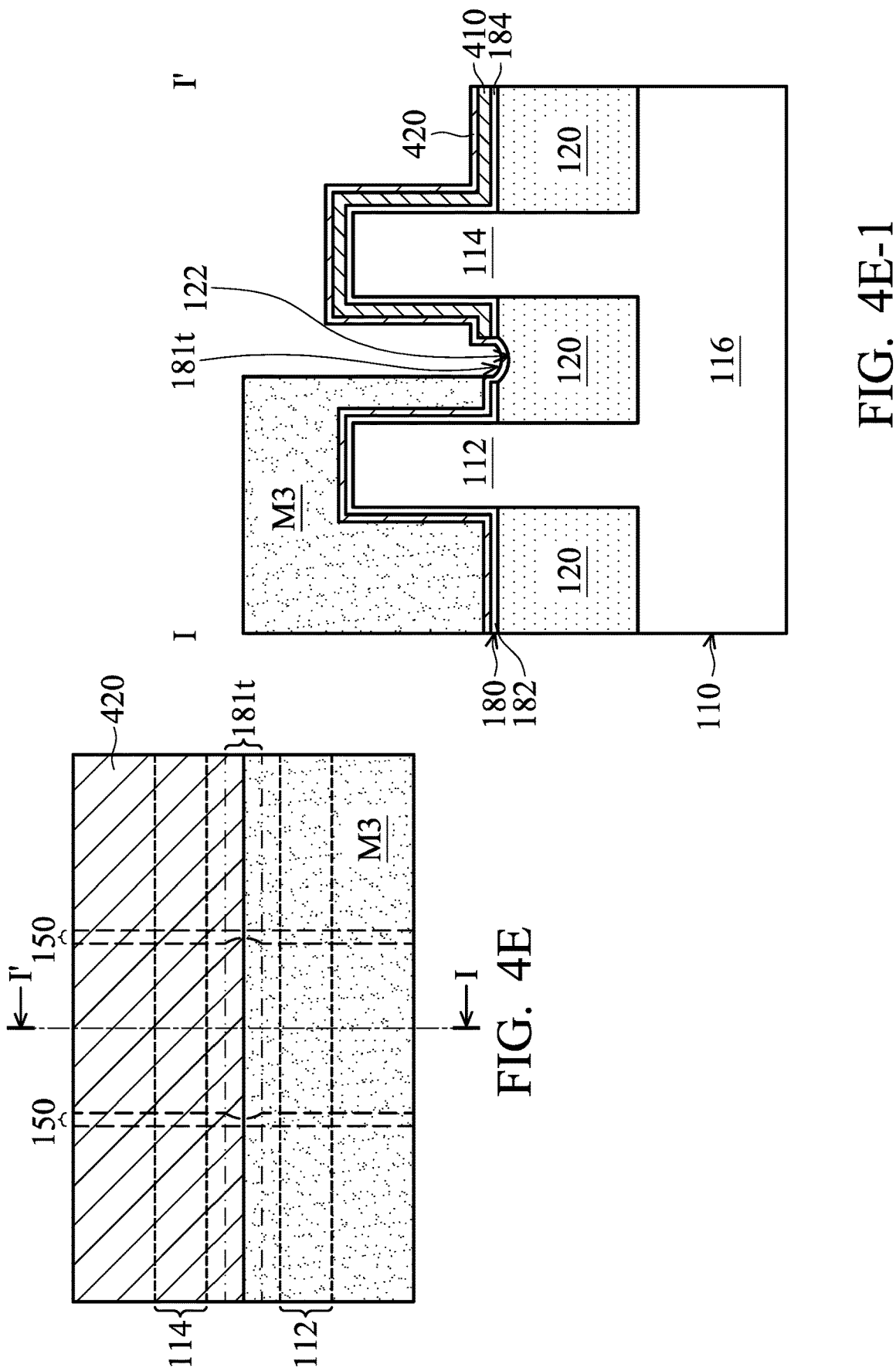
Figures 1, 4F:
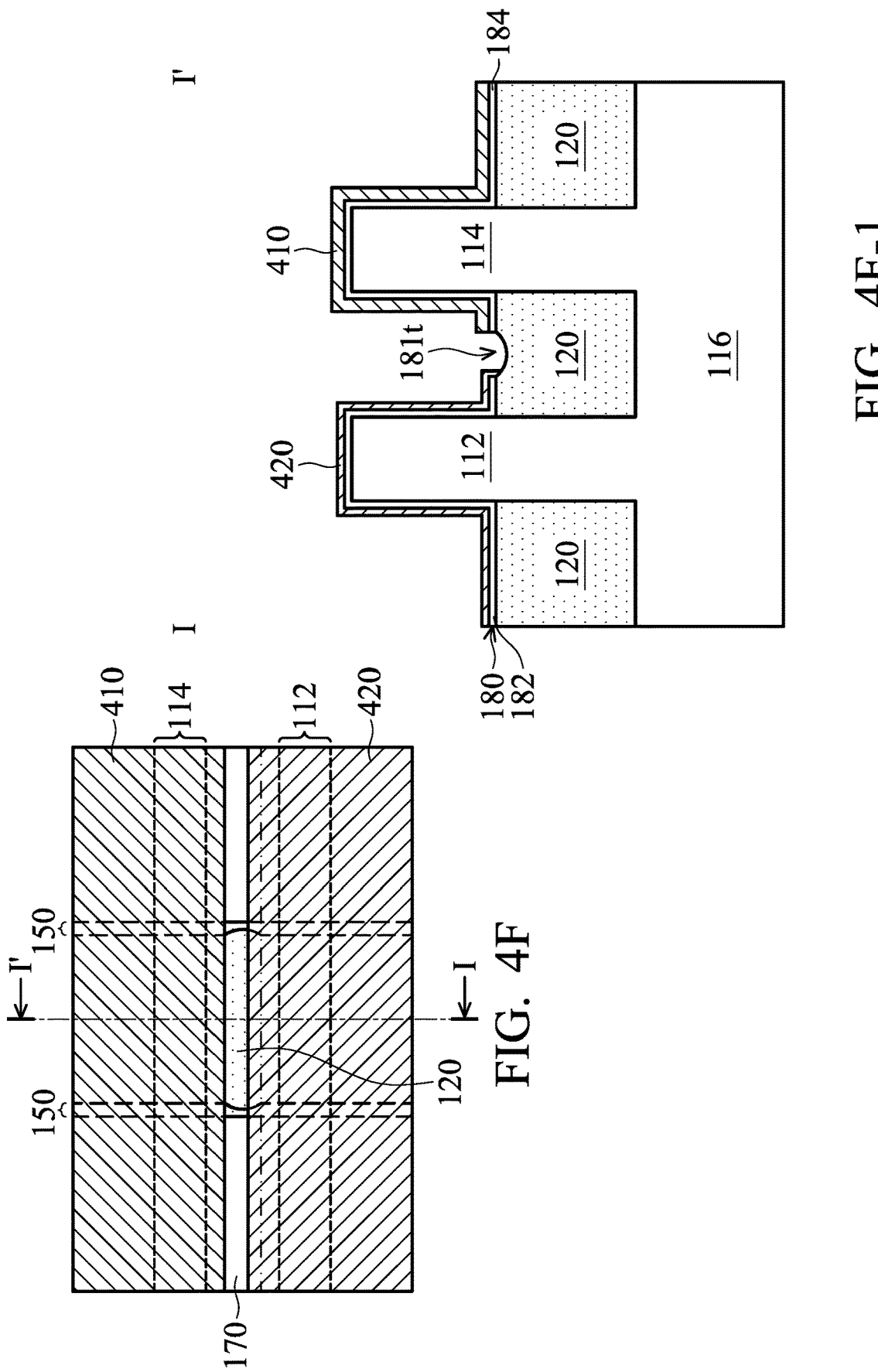
Figures 1, 4G:
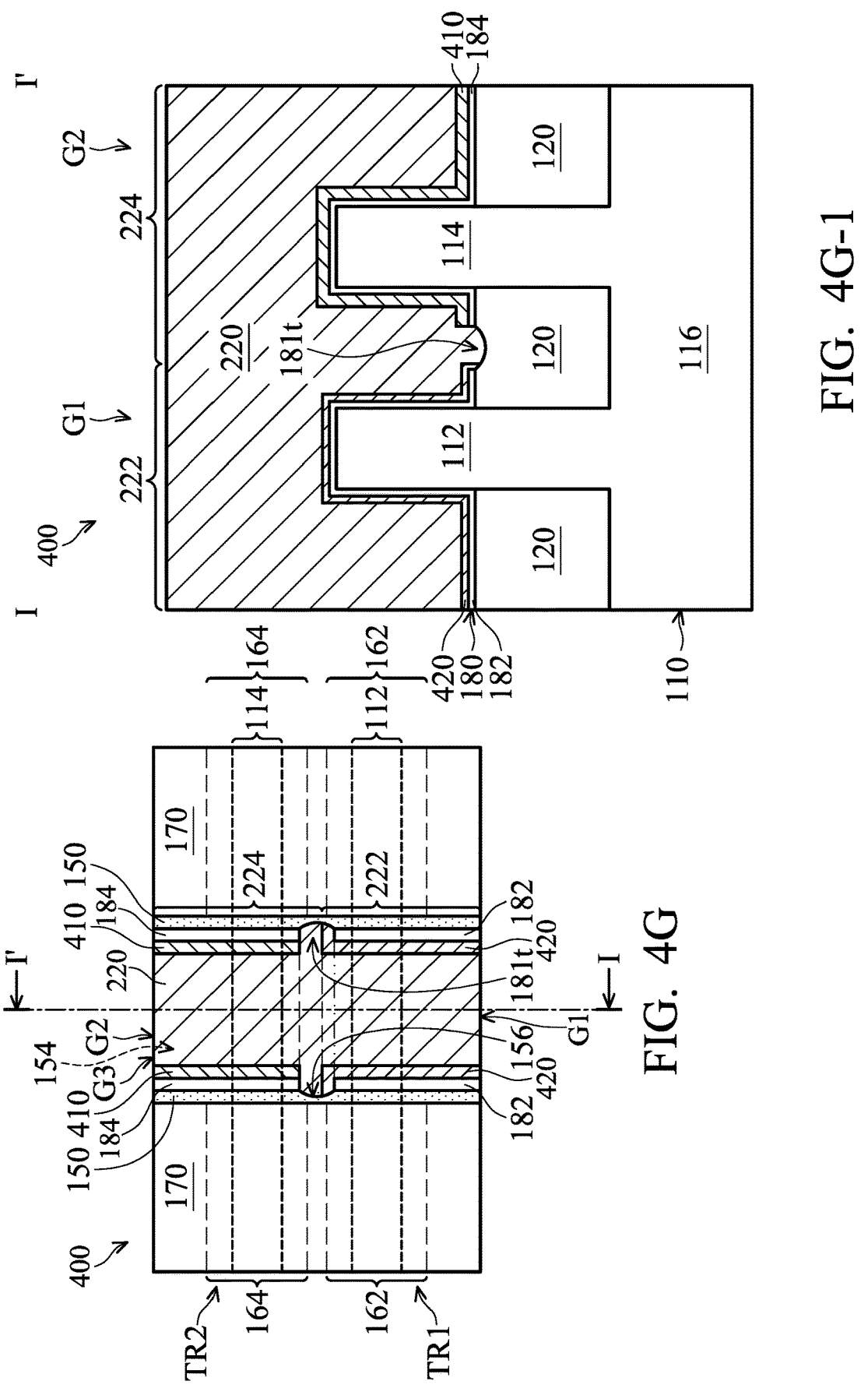
Figures 2, 4G:
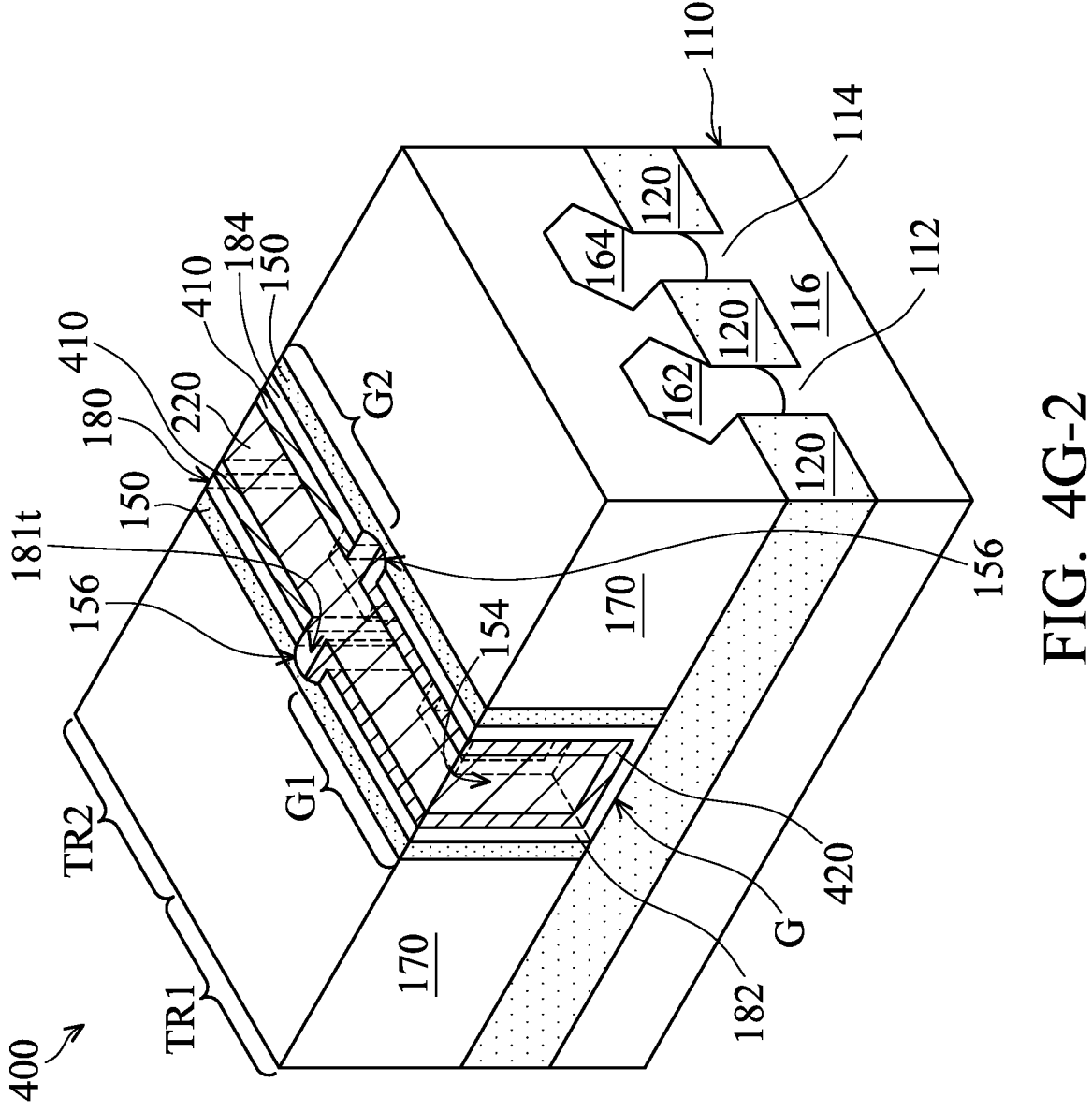

FIGS. 4A-4G are top views of various stages of a process for forming a semiconductor device structure, in accordance with some embodiments. FIGS. 4A-1 to 4G-1 are cross-sectional views illustrating the semiconductor device structure along a sectional line I-I' in FIGS. 4A-4G, in accordance with some embodiments. FIG. 4A-2 is a perspective view of the semiconductor device structure of FIG. 4A, in accordance with some embodiments.

After the step of FIG. 2D, as shown in FIGS. 4A, 4A-1, and 4A-2, a gate dielectric layer 180 is deposited over the fins 112 and 114, the isolation layer 120, which are exposed by the trench 154 of the spacer layer 150, the spacer layer 150, and the dielectric layer 170, in accordance with some embodiments.

As shown in FIGS. 4B and 4B-1, a work function layer 410 is formed over the gate dielectric layer 180, in accordance with some embodiments. The work function layer 410 conformally covers the gate dielectric layer 180, in accordance with some embodiments. The work function layer 410 provides a desired work function for transistors to enhance device performance including improved threshold voltage.

In the embodiments of forming an NMOS transistor, the work function layer 410 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function layer 410 can be a p-type metal capable of providing a work function value suitable for the device, such as equal to or greater than about 4.8 eV. The p-type metal may be made of metal, metal carbide, metal nitride, other suitable materials, or a combination thereof.

For example, the p-type metal is made of titanium, titanium nitride, other suitable materials, or a combination thereof. The work function layer 410 is formed using a deposition process, a photolithography process, and an etching process, in accordance with some embodiments. The deposition process includes a physical vapor deposition (PVD) process, a CVD process, an atomic layer deposition (ALD), a plating process, another suitable method, or a combination thereof.

As shown in FIGS. 4B and 4B-1, a mask layer M1 is formed over the work function layer 410 over the fin 114, in accordance with some embodiments. The mask layer M1 is made of a photoresist material or another suitable material, which is different from the material of the work function layer 410, in accordance with some embodiments.

As shown in FIGS. 4B, 4C and 4C-1, a portion of the work function layer 410, which is not covered by the mask layer M1, is removed, in accordance with some embodiments. The removal process includes an etching process such as a dry etching process, in accordance with some embodiments. As shown in FIGS. 4C and 4C-1, the mask layer M1 is removed, in accordance with some embodiments.

As shown in FIGS. 4C and 4C-1, a mask layer M2 is formed over the work function layer 410 and the gate dielectric layer 180, in accordance with some embodiments. The mask layer M2 has an opening OP1 exposing portions of the work function layer 410 and the gate dielectric layer 180, in accordance with some embodiments.

The mask layer M2 is made of a photoresist material or another suitable material, which is different from the material of the work function layer 410 and the gate dielectric layer 180, in accordance with some embodiments.

As shown in FIGS. 4C-1, 4D and 4D-1, the exposed portions of the work function layer 410 and the gate dielectric layer 180 are removed through the opening OP1 of the mask layer M2, in accordance with some embodiments. As shown in FIGS. 4C-1, 4D and 4D-1, the portion of the gate dielectric layer 180 originally under the exposed portion of the work function layer 410 is removed through the opening OP1 of the mask layer M2, in accordance with some embodiments.

The removal process forms a trench 181t in the gate dielectric layer 180, in accordance with some embodiments. The trench 181t exposes a portion of the isolation layer 120, in accordance with some embodiments. The gate dielectric layer 180 is divided into parts 182 and 184 by the trench 181t, in accordance with some embodiments.

As shown in FIGS. 4C-1, 4D and 4D-1, portions of the isolation layer 120 and the spacer layer 150 are removed through the opening OP1 of the mask layer M2, in accordance with some embodiments. The removal process forms a trench 122 in the isolation layer 120 and a trench 156 in the spacer layer 150, in accordance with some embodiments. The removal process includes an etching process such as a dry etching process, in accordance with some embodiments. As shown in FIGS. 4D and 4D-1, the mask layer M2 is removed, in accordance with some embodiments.

As shown in FIGS. 4E and 4E-1, a work function layer 420 is formed over the gate dielectric layer 180, the work function layer 410, and the isolation layer 120, in accordance with some embodiments. The work function layer 420 conformally covers the gate dielectric layer 180, the work function layer 410, and the isolation layer 120, in accordance with some embodiments.

The work function layer 420 is partially in the trench 181t of the dielectric layer 180 and the trench 122 of the isolation layer 120, in accordance with some embodiments.

The work function layer 420 provides a desired work function for transistors to enhance device performance including improved threshold voltage.

In the embodiments of forming an NMOS transistor, the work function layer 420 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function layer 420 can be a p-type metal capable of providing a work function value suitable for the device, such as equal to or greater than about 4.8 eV. The p-type metal may be made of metal, metal carbide, metal nitride, other suitable materials, or a combination thereof.

For example, the p-type metal is made of titanium, titanium nitride, other suitable materials, or a combination thereof. The work function layer 420 is formed using a deposition process, a photolithography process, and an etching process, in accordance with some embodiments. The deposition process includes a physical vapor deposition (PVD) process, a CVD process, an atomic layer deposition (ALD), a plating process, another suitable method, or a combination thereof.

As shown in FIGS. 4E and 4E-1, a mask layer M3 is formed over the work function layer 420 over the fin 112, in accordance with some embodiments. The mask layer M3 is made of a photoresist material or another suitable material, which is different from the material of the work function layer 420, in accordance with some embodiments.

As shown in FIGS. 4E-1, 4F and 4F-1, a portion of the work function layer 420, which is not covered by the mask layer M3, is removed, in accordance with some embodiments. The removal process includes an etching process such as a dry etching process, in accordance with some embodiments. As shown in FIGS. 4F and 4F-1, the mask layer M3 is removed, in accordance with some embodiments.

FIG. 4G-2 is a perspective view of the semiconductor device structure of FIG. 4G, in accordance with some embodiments. As shown in FIGS. 4G, 4G-1, and 4G-2, the steps of FIGS. 2H-2I are performed to form a gate electrode 220 over the work function layers 410 and 420 and the isolation layer 120, in accordance with some embodiments.

As shown in FIG. 4G-1, a left portion 222 of the gate electrode 220, the work function layer 420, and the part 182 of the gate dielectric layer 180 together form a gate stack G1, in accordance with some embodiments. As shown in FIGS. 4G and 4G-2, the gate stack G1 and the source/drain structures 162 together form a transistor TR1, in accordance with some embodiments.

As shown in FIG. 4G-1, a right portion 224 of the gate electrode 220, the work function layer 410, and the part 184 of the gate dielectric layer 180 together form a gate stack G2, in accordance with some embodiments. As shown in FIGS. 4G and 4G-2, the gate stack G2 and the source/drain structures 164 together form a transistor TR2, in accordance with some embodiments. The gate stacks G1 and G2 together form a gate stack G3, in accordance with some embodiments. In this step, a semiconductor device structure 400 is substantially formed, in accordance with some embodiments.

Since the gate dielectric layer 180 is one of the metal atom diffusion paths between the transistors TR1 and TR2, the trench 181*t* in the dielectric layer 180 and between transistors TR1 and TR2 may cut off this diffusion path. Therefore, the trench 181*t* may reduce the metal boundary effect. Therefore, the performance of the transistors TR1 and TR2 (or the semiconductor device structure 400) is improved, in accordance with some embodiments.

Processes and materials for forming the semiconductor device structures 300 and 400 may be similar to, or the same as, those for forming the semiconductor device structure 200 described above. Elements designated by the same or similar reference numbers as those in FIGS. 1A to 4G-2 have the same or similar structures and the materials.

Therefore, the detailed descriptions thereof will not be repeated herein.

In accordance with some embodiments, semiconductor device structures and methods for forming the same are provided. The methods (for forming the semiconductor device structure) form a trench in a gate dielectric layer between two fins. Since the gate dielectric layer is one of the metal atom diffusion paths between two adjacent transistors over the two fins respectively, the trench may cut off or narrow the metal atom diffusion path. Therefore, the trench may reduce the metal boundary effect. Therefore, the performance of the semiconductor device structure is improved.

In accordance with some embodiments, a method for forming a semiconductor device structure is provided. The method includes forming an isolation layer over a substrate. The substrate has a base, a first fin, and a second fin over the base, the isolation layer is over the base, and the first fin and the second fin are partially in the isolation layer. The method includes forming a spacer layer over the first fin, the second fin, and the isolation layer. The spacer layer has a first trench partially exposing the first fin and the second fin. The method includes forming a gate dielectric layer in the first trench and covering the first fin, the second fin, and the isolation layer exposed by the first trench. The method includes partially removing the gate dielectric layer to form a second trench in the gate dielectric layer and between the first fin and the second fin. The gate dielectric layer is divided into a first part and a second part by the second trench. The method includes forming a gate electrode in the first trench of the spacer layer and over the gate dielectric layer.

In accordance with some embodiments, a method for forming a semiconductor device structure is provided. The method includes providing a substrate having a base, a first fin, and a second fin over the base. The method includes forming a spacer layer over the first fin, the second fin, and the base. The spacer layer has a first trench exposing the first fin and the second fin. The method includes forming a gate dielectric layer in the first trench and covering the first fin, the second fin, and the base under the first trench. The method includes partially removing the gate dielectric layer to form a second trench in the gate dielectric layer and between the first fin and the second fin, wherein a first portion of the gate dielectric layer under the second trench is thinner than a second portion of the gate dielectric layer covering the first fin. The method includes forming a gate electrode in the first trench of the spacer layer and over the gate dielectric layer.

In accordance with some embodiments, a semiconductor device structure is provided. The semiconductor device structure includes a substrate having a base, a first fin, and a second fin over the base. The semiconductor device structure includes an isolation layer over the base. The first fin and the second fin are partially in the isolation layer. The semiconductor device structure includes a gate stack over the first fin, the second fin, and the isolation layer. The gate stack includes a gate dielectric layer and a gate electrode over the gate dielectric layer, the gate dielectric layer has a first part and a second part spaced apart from each other, and the first part and the second part cover the first fin and the second fin respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming an isolation layer over a substrate, wherein the substrate has a base, a first fin, and a second fin over the base, the isolation layer is over the base, and the first fin and the second fin are partially in the isolation layer;

forming a spacer layer over the first fin, the second fin, and the isolation layer, wherein the spacer layer has a first trench partially exposing the first fin and the second fin;

forming a gate dielectric layer in the first trench and covering the first fin, the second fin, and the isolation layer exposed by the first trench;

partially removing the gate dielectric layer to form a second trench in the gate dielectric layer and between the first fin and the second fin, wherein the gate dielectric layer is divided into a first part and a second part by the second trench, the gate dielectric layer has a thinner portion between a bottom of the second trench and the isolation layer, and the thinner portion links the first part and the second part; and forming a gate electrode in the first trench of the spacer layer and over the gate dielectric layer, wherein the gate electrode extends along a top of the thinner portion.

2. The method for forming the semiconductor device structure as claimed in claim 1, further comprising:

forming a first work function layer in the first trench of the spacer layer and over the first part of the gate dielectric layer before forming the gate electrode in the first trench of the spacer layer and over the gate dielectric layer, wherein the first work function layer is partially in the second trench of the gate dielectric layer, and the gate electrode is formed over the first work function layer.

3. The method for forming the semiconductor device structure as claimed in claim 2, further comprising:

forming a second work function layer in the first trench of the spacer layer and over the second part of the gate dielectric layer and the first work function layer before forming the gate electrode in the first trench of the spacer layer and over the gate dielectric layer, wherein the second work function layer is partially in the second trench of the gate dielectric layer, and the gate electrode is further formed over the second work function layer.

4. The method for forming the semiconductor device structure as claimed in claim 3, wherein the first work function layer and the second work function layer are in direct contact with the isolation layer.

5. The method for forming the semiconductor device structure as claimed in claim 1, further comprising:

forming a first source/drain structure over the first fin; and forming a second source/drain structure over the second fin, wherein the first source/drain structure and the second source/drain structure are formed using different epitaxial processes.

6. The method for forming the semiconductor device structure as claimed in claim 5, wherein the first source/drain structure and the second source/drain structure are made of different materials.

7. The method for forming the semiconductor device structure as claimed in claim 1, wherein the gate dielectric layer is formed to have a first sidewall portion and a second sidewall portion, each of the first sidewall portion and the second sidewall portion extends along a sidewall of the first trench, and the first sidewall portion is thinner than the second sidewall portion.

8. The method for forming the semiconductor device structure as claimed in claim 7, further comprising:

forming a first work function layer extending along a top and a sidewall of the first fin, wherein the first work function layer partially covers the first sidewall portion.

9. The method for forming the semiconductor device structure as claimed in claim 8, further comprising:

forming a second work function layer extending along a top and a sidewall of the second fin, wherein second first work function layer partially covers the first sidewall portion and the first work function layer.

10. The method for forming the semiconductor device structure as claimed in claim 5, wherein the thinner portion of the gate dielectric layer is between the first source/drain structure and the second source/drain structure in a top view of the gate dielectric layer, the first source/drain structure, and the second source/drain structure.

11. A method for forming a semiconductor device structure, comprising:

providing a substrate having a base, a first fin, and a second fin over the base;

forming a spacer layer over the first fin, the second fin, and the base, wherein the spacer layer has a first trench partially exposing the first fin and the second fin;

forming a gate dielectric layer in the first trench and covering the first fin, the second fin, and the base under the first trench;

partially removing the gate dielectric layer to form a second trench in the gate dielectric layer and between the first fin and the second fin, wherein a first portion of the gate dielectric layer under the second trench is thinner than a second portion of the gate dielectric layer covering the first fin; and forming a gate electrode in the first trench of the spacer layer and over the gate dielectric layer, wherein the gate electrode covers the first portion of the gate dielectric layer.

12. The method for forming the semiconductor device structure as claimed in claim 11, wherein the first portion of the gate dielectric layer under the second trench is thinner than a third portion of the gate dielectric layer covering the second fin.

13. The method for forming the semiconductor device structure as claimed in claim 11, wherein the gate dielectric layer conformally covers the first fin and the second fin.

14. The method for forming the semiconductor device structure as claimed in claim 11, wherein the gate dielectric layer has a bottom portion and a sidewall portion, the bottom portion covers the base, the sidewall portion covers an inner wall of the first trench of the spacer layer, and the second trench is in the bottom portion and the sidewall portion.

15. The method for forming the semiconductor device structure as claimed in claim 11, wherein the second trench of the gate dielectric layer has a straight strip shape in a top view of the gate dielectric layer.

16. A method for forming a semiconductor device structure, comprising:

forming a first channel structure and a second channel structure over a substrate;

forming an isolation structure over the substrate, wherein a portion of the isolation structure is laterally between the first channel structure and the second channel structure;

forming a gate dielectric layer extending over sidewalls of the first channel structure and the second channel structure and the portion of the isolation structure;

partially removing the gate dielectric layer to form a trench extending towards the substrate, wherein the trench is over the portion of the isolation structure, and a thinner portion of the gate dielectric layer is between a bottom of the trench and the portion of the isolation structure; and forming a gate electrode over the gate dielectric layer to cover the thinner portion of the gate dielectric layer after the trench is formed.

17. The method for forming the semiconductor device structure as claimed in claim 16, further comprising:

forming a dummy gate stack partially covering the first channel structure, the second channel structure, and the isolation structure;

forming a gate spacer along a sidewall of the dummy gate stack; and removing the dummy gate stack after the gate spacer is formed.

18. The method for forming the semiconductor device structure as claimed in claim 16, further comprising:

forming a first work function layer extending along a top and a sidewall of the first channel structure, wherein the first work function layer partially covers the thinner portion of the gate dielectric layer.

19. The method for forming the semiconductor device structure as claimed in claim 18, further comprising:

forming a second work function layer extending along a top and a sidewall of the second channel structure, wherein the second work function layer partially covers the thinner portion of the gate dielectric layer and the first work function layer.

20. The method for forming the semiconductor device structure as claimed in claim 19, wherein the first work function layer and the second work function layer are in direct contact with the thinner portion of the gate dielectric layer.

* * * * *